US009209294B1

(12) United States Patent
Kiyosawa et al.

(10) Patent No.: US 9,209,294 B1
(45) Date of Patent: Dec. 8, 2015

(54) SEMICONDUCTOR DEVICE AND METHOD FOR MANUFACTURING SAME

(71) Applicant: PANASONIC CORPORATION, Osaka (JP)

(72) Inventors: Tsutomu Kiyosawa, Toyama (JP); Chiaki Kudou, Toyama (JP); Yuki Tomita, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/377,430

(22) PCT Filed: Jan. 23, 2013

(86) PCT No.: PCT/JP2013/000317
§ 371 (c)(1),
(2) Date: Aug. 7, 2014

(87) PCT Pub. No.: WO2013/118437
PCT Pub. Date: Aug. 15, 2013

(30) Foreign Application Priority Data

Feb. 10, 2012 (JP) ................................. 2012-026949
Feb. 10, 2012 (JP) ................................. 2012-027393

(51) Int. Cl.
*H01L 29/76* (2006.01)
*H01L 21/336* (2006.01)
(Continued)

(52) U.S. Cl.
CPC ...... *H01L 29/7813* (2013.01); *H01L 21/02378* (2013.01); *H01L 21/02529* (2013.01);
(Continued)

(58) Field of Classification Search
CPC ................. H01L 2924/13091; H01L 29/1095;
H01L 29/7813; H01L 29/4236; H01L 29/66734; H01L 29/66666; H01L 29/66712; H01L 29/66719; H01L 29/7802; H01L 29/8083
USPC ........................... 438/268–272; 257/341–346
See application file for complete search history.

(56) References Cited

U.S. PATENT DOCUMENTS 6,342,709 B1    1/2002 Sugawara et al.
7,161,208 B2 *  1/2007 Spring ................ H01L 29/0623
                                                              257/328

(Continued)

FOREIGN PATENT DOCUMENTS

EP          0345380 A2    12/1989
JP          01-310576 A   12/1989

(Continued)

OTHER PUBLICATIONS

International Search Report issued in PCT/JP2013/000317, dated Apr. 16, 2013, with English translation.

*Primary Examiner* — H Tsai
(74) *Attorney, Agent, or Firm* — McDermott Will & Emery LLP

(57) ABSTRACT

A method for manufacturing a semiconductor device includes the steps of: forming, on a principal face of a substrate, a semiconductor layer including a first semiconductor region of a first conductivity type; and forming, in the semiconductor layer, a trench having a bottom located in the first semiconductor region. The method further includes a step of forming a trench bottom impurity region being of a second conductivity type and covering the bottom of the trench by performing annealing to cause part of the semiconductor layer corresponding to an upper corner portion of the trench to move to be placed on the bottom of the trench.

20 Claims, 16 Drawing Sheets

(51) Int. Cl.
  *H01L 29/78* (2006.01)
  *H01L 21/324* (2006.01)
  *H01L 29/66* (2006.01)
  *H01L 21/306* (2006.01)
  *H01L 29/417* (2006.01)
  *H01L 29/16* (2006.01)
  *H01L 21/04* (2006.01)
  *H01L 21/223* (2006.01)
  *H01L 21/02* (2006.01)

(52) U.S. Cl.
  CPC .......... *H01L21/0455* (2013.01); *H01L 21/223* (2013.01); *H01L 21/30604* (2013.01); *H01L 21/324* (2013.01); *H01L 29/1608* (2013.01); *H01L 29/41741* (2013.01); *H01L 29/66068* (2013.01); *H01L 29/66734* (2013.01)

(56) References Cited

U.S. PATENT DOCUMENTS

| | | |
|---|---|---|
| 2003/0224588 A1 | 12/2003 | Yamauchi et al. |
| 2006/0081919 A1 | 4/2006 | Inoue et al. |
| 2008/0164516 A1 | 7/2008 | Darwish |
| 2009/0032821 A1 | 2/2009 | Onose et al. |
| 2009/0078995 A1 | 3/2009 | Nakagawa et al. |
| 2012/0228640 A1 | 9/2012 | Masuda et al. |

FOREIGN PATENT DOCUMENTS

| | | |
|---|---|---|
| JP | 10-098188 A | 4/1998 |
| JP | 2001-267570 A | 9/2001 |
| JP | 2002-343805 A | 11/2002 |
| JP | 3743395 B2 | 2/2006 |
| JP | 2006-120789 A | 5/2006 |
| JP | 4099029 B2 | 3/2008 |
| JP | 2008-192998 A | 8/2008 |
| JP | 2008-227514 A | 9/2008 |
| JP | 2009-033036 A | 2/2009 |
| JP | 2009-094484 A | 4/2009 |
| JP | 2010-034147 A | 2/2010 |
| JP | 2010-516058 A | 5/2010 |
| JP | 4843854 B2 | 12/2011 |
| JP | 4924563 B2 | 4/2012 |
| WO | 2012-017796 A1 | 2/2012 |

* cited by examiner

SEMICONDUCTOR DEVICE AND METHOD FOR MANUFACTURING SAME

RELATED APPLICATIONS

This application is the U.S. National Phase under 35 U.S.C. §371 of International Application No. PCT/JP2013/000317, filed on Jan. 23, 2013, which in turn claims the benefit of Japanese Application No. 2012-026949, filed on Feb. 10, 2012, and Japanese Application No. 2012-027393, filed on Feb. 10, 2012, the disclosures of which Applications are incorporated by reference herein.

TECHNICAL FIELD

The present disclosure relates to semiconductor devices and manufacturing method of the semiconductor devices, and in particular, to semiconductor devices (power semiconductor devices) capable of withstanding a high voltage and a large current.

BACKGROUND ART

Silicon carbide (SiC), of which the band gap and the dielectric breakdown voltage strength are greater than those of silicon (Si), is a semiconductor material which is expected to be applied to next-generation low-loss power devices, for example. SiC exists in various polytypes such as 3C-SiC which is a cubic system, 6H-SiC and 4H-SiC which are hexagonal systems. Among the polytypes, 4H-SiC is generally used for producing silicon carbide semiconductor devices.

A typical power device including SiC and serving as a switching element is a field effect transistor such as a metal insulator semiconductor field effect transistor (hereinafter referred to as a "MISFET") or a metal semiconductor field effect transistor (hereinafter referred to as a "MESFET"). A metal oxide semiconductor field effect transistor (hereinafter referred to as a "MOSFET") is a kind of the MISFETs.

Such a switching element can be switched, by means of a voltage applied between its gate electrode and source electrode, between the on state in which a drain current of several amperes or more flows and the off state in which no drain current flows. In the off state, the switching element can withstand a high voltage of several hundred volts or more.

Further, a Schottky diode and a pn diode are typically used as rectifier elements, for example. These diodes are expected to serve as rectifier elements capable of withstanding a large current and a high voltage.

Since SiC has a dielectric breakdown field and a thermal conductivity which are greater than those of Si, designing a power device including SiC (a SiC power device) capable of withstanding a high voltage with low loss is easier than designing a Si power device capable of withstanding a high voltage with low loss. Accordingly, it is possible to produce a SiC power device which performs as well as a Si power device, and has considerably reduced area and thickness as compared to those of the Si power device.

Increasing the integration density of a power device such as a MISFET is effective at enabling a larger current to flow through the power device. In view of this, vertical power MISFETs with a trench gate structure have been proposed as a replacement for devices having a conventional planar gate structure. Since a MISFET with a trench gate structure includes a channel region formed on the side faces of a trench formed in a semiconductor layer, the unit cell area can be reduced and the integration density of the device can be increased.

A conventional semiconductor device which is a vertical MOSFET having a trench gate structure will be described below.

The conventional semiconductor device includes a substrate made of silicon carbide, a silicon carbide layer including an N-type drift region and a P-type body region and formed on the substrate, and an N-type source region formed in a portion of a surface of the body region. The conventional semiconductor device further includes a trench penetrating the source region and the body region and reaching the drift region, a gate insulating film covering the side faces and the bottom of the trench, and a gate electrode occupying the inside of the trench and located on the gate insulating film. A source electrode being in contact with the source region and the body region is provided on the silicon carbide layer, and a drain electrode is provided on the back face of the substrate.

In the vertical MOSFET thus configured, when a high voltage is applied between the source and drain, concentration of electric field is likely to occur on the bottom of the trench, which causes a dielectric breakdown in the gate insulating film on the bottom of the trench. To address this problem, a method of reducing an electric field applied to the bottom of a trench by forming a P-type region on the bottom of the trench has been proposed. For example, after forming a P-type region in a silicon carbide layer by ion implantation, a trench is formed (see Patent Document 1).

CITATION LIST

Patent Document

PATENT DOCUMENT 1: Japanese Unexamined Patent Publication No. 2001-267570
PATENT DOCUMENT 2: Japanese Unexamined Patent Publication No. 2009-33036

SUMMARY OF THE INVENTION

Technical Problem

According to the method of Patent Document 1, however, positional misalignment is likely to occur between the P-type region and the trench. The misalignment disadvantageously causes an end portion of the trench bottom to be left uncovered by the P-type region, and concentration of electric field occurs in the end portion, resulting in a dielectric breakdown. In addition, near the other end portion of the trench bottom, the P-type region extends outside from the trench bottom toward the principal face of the substrate. Consequently, a depletion area increases in a portion of the drift region (of N-type) located between the extending portion of the P-type region and the body region (of P-type), resulting in a disadvantage that a parasitic resistance component (a Junction FET (JFET) resistance component) increases and on-resistance of the semiconductor device increases. It is possible to form a P-type region which is larger than the bottom of a trench and surely covers the bottom of the trench. In such a case, however, the parasitic resistance component is likely to increase.

In view of the foregoing, a technique to prevent misalignment in a semiconductor device having a trench gate structure, and to prevent concentration of electric field and increase in on-resistance which can be caused by the misalignment will be described hereafter in the present disclosure.

Solution to the Problem

A method for manufacturing a semiconductor device of the present disclosure includes the steps of: forming, on a principal face of a substrate, a semiconductor layer including a first semiconductor region of a first conductivity type; forming, in the semiconductor layer, a trench having a bottom located in the first semiconductor region; and forming a trench bottom impurity region being of a second conductivity type and covering the bottom of the trench by performing annealing to cause part of the semiconductor layer to move to be placed on the bottom of the trench, where the part corresponds to an upper corner portion of the trench.

A semiconductor device of the present disclosure includes: a substrate; a semiconductor layer formed on a principal face of the substrate and including a first semiconductor region of a first conductivity type; a trench formed in the semiconductor layer and having a bottom located in the first semiconductor region; and a trench bottom impurity region being of the second conductivity type and covering the bottom of the trench, wherein in an upper peripheral portion of the trench, an upper face of the semiconductor layer is downwardly oblique toward an inside of the trench.

Advantages of the Invention

According to the semiconductor device and the manufacturing method thereof, the impurity region can be formed on the bottom of the trench without misalignment. It is thus possible to reduce concentration of electric field and increase in on-resistance which can be caused by the misalignment.

DESCRIPTION OF EMBODIMENTS

Figure 1A:
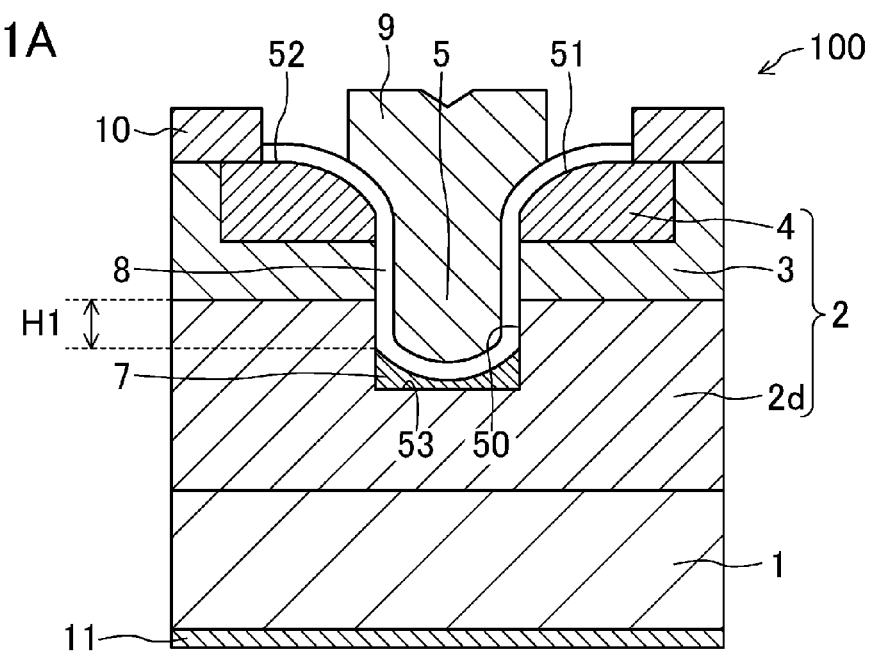
FIGS. 1A and 1B are respectively a cross-sectional view and a plan view which schematically illustrate a structure of an illustrative semiconductor device according to a first embodiment of the present disclosure.

A method in which, after formation of a trench, a P-type region is formed on the bottom of the trench by ion implantation has conventionally been proposed (see Patent Document 2). According to the method of Patent Document 2, however, since ions are implanted into the bottom of the trench which has already been formed, the wall of the trench suffers roughness and the like caused by ion implantation damage and activation annealing. The roughness and the like reduce channel mobility and reliability of a gate insulating film.

On the other hand, a semiconductor device of the present disclosure includes a substrate, a semiconductor layer provided on a principal face of the substrate and including a first semiconductor region of a first conductivity type (e.g. N-type), a trench (a recess) formed in the semiconductor layer and having a bottom located in the first semiconductor region; and a trench bottom impurity region being of the second conductivity type (e.g., P-type) and covering the bottom of the trench, wherein, in an upper peripheral portion of the trench, an upper face of the semiconductor layer is downwardly oblique toward an inside of the trench.

As will be described later, the trench bottom impurity region is formed by performing annealing to cause part of the semiconductor layer (e.g., silicon carbide) corresponding to an upper corner portion of the trench to move to the bottom of the trench. Accordingly, the trench bottom impurity region is formed in a self-aligned manner so as to cover the trench bottom, and the side faces of the trench coincide with the side faces of the trench bottom impurity region. It is thus possible to prevent concentration of electric field and increase in on-resistance which can be caused by misalignment.

A more specific example of the semiconductor device may be a MISFET having a trench gate structure. That is, the semiconductor layer includes a drift region which is the first semiconductor region, a body region which is of the second conductivity type and provided on the drift region, and a second semiconductor region (a source region) which is of the first conductivity type and provided on the body region. The trench penetrates the second semiconductor region and the body region, and reaches the inside of the drift region. The semiconductor device further includes a gate insulating film covering the side faces of the trench and an upper face of the trench bottom impurity region, and a gate electrode provided on the gate insulating film and extending at least in the trench.

The semiconductor device may further include a channel layer which is of the first conductivity type and provided at least between the body region and the gate insulating film. It is preferable that the impurity concentration of the channel layer is higher than that of the drift region.

The thus configured channel layer makes depletion unlikely to occur in the first conductivity type region located between the body region and the trench bottom impurity region formed on the trench bottom. Consequently, it is possible to reduce a parasitic resistance component (a JFET resistance component).

A method for manufacturing the semiconductor device of the present disclosure includes the steps of: forming, on a principal face of a substrate, a semiconductor layer including a first semiconductor region of a first conductivity type; forming, in the semiconductor layer, a trench extending in the semiconductor layer and having a bottom located in the first semiconductor region; and forming a trench bottom impurity region being of a second conductivity type and covering the bottom of the trench by performing annealing to cause part of the semiconductor layer corresponding to an upper corner portion of the trench to move to be placed on the bottom of the trench. In this step, the annealing is performed in an atmosphere containing a dopant gas of the second conductivity type, thereby forming the trench bottom impurity region of the second conductivity type. Alternatively, a trench top impurity region of the second conductivity type is formed, in advance, in the trench upper corner portion, and part of the trench top impurity region is caused to move to the trench bottom, thereby forming the trench bottom impurity region of the second conductivity type.

According to this manufacturing method, the trench bottom impurity region can be formed in a self-aligned manner with respect to the trench, and misalignment can be reduced. It is accordingly possible to reduce or prevent concentration of electric field and increase in the on-resistance which can be caused by the misalignment.

Further, since the trench bottom impurity region can be formed by performing annealing, the wall of the trench does not suffer damage which could be caused by ion implantation. In addition, since the manufacturing method enables formation of the trench bottom impurity region at a temperature lower than a temperature of activation annealing in ion plantation, the roughness on the wall of the trench can be reduced as compared to a case where ion implantation is performed.

More specifically, according to the manufacturing method of the semiconductor device, the semiconductor layer may be formed so as to include a drift region which is a first semiconductor region and of a first conductivity type, a body region which is of the second conductivity type and provided on the drift region, and an impurity region which is of the first conductivity type and provided on the body region. Further, a trench top impurity region of the second conductivity type may be formed on the impurity region of the first conductivity type. The trench may penetrate the second semiconductor region and the body region, and reach the inside of the drift region. Moreover, after forming the trench bottom impurity region, the manufacturing method may further include a step of forming a gate insulating film covering the side faces of the trench and the upper face of the trench bottom impurity region, and a step of forming a gate electrode extending on the gate insulating film and at least in the trench. In this manner, a semiconductor device which is, e.g., a MISFET can be manufactured.

In addition, before the step of forming the gate insulating film, the manufacturing method may further include a step of epitaxially growing an epitaxial layer (a channel layer) which is of the first conductivity type and has an impurity concentration higher than that of the drift region on side faces of the body region constituting part of the side faces of the trench.

According to this method, depletion is unlikely to occur in the N-type region located between the body region and the trench bottom impurity region formed on the trench bottom. Accordingly, it is possible to effectively reduce a parasitic resistance component (a JFET resistance component).

After performing the annealing to form the trench bottom impurity region, etching may be performed in a hydrogen atmosphere.

In this manner, even if a semiconductor layer of the second conductivity type has been formed on the side face of the trench, such a semiconductor layer can be eliminated.

First Embodiment

—Structure of Semiconductor Device—

An illustrative semiconductor device 100 according to a first embodiment of the present disclosure and a manufacturing method thereof will be described below with reference to the drawings.

For example, the semiconductor device 100 includes a plurality of unit cells each of which is a SiC-metal-insulator-semiconductor field-effect transistor (SiC-MISFET) having a trench gate structure.

Figure 1B:
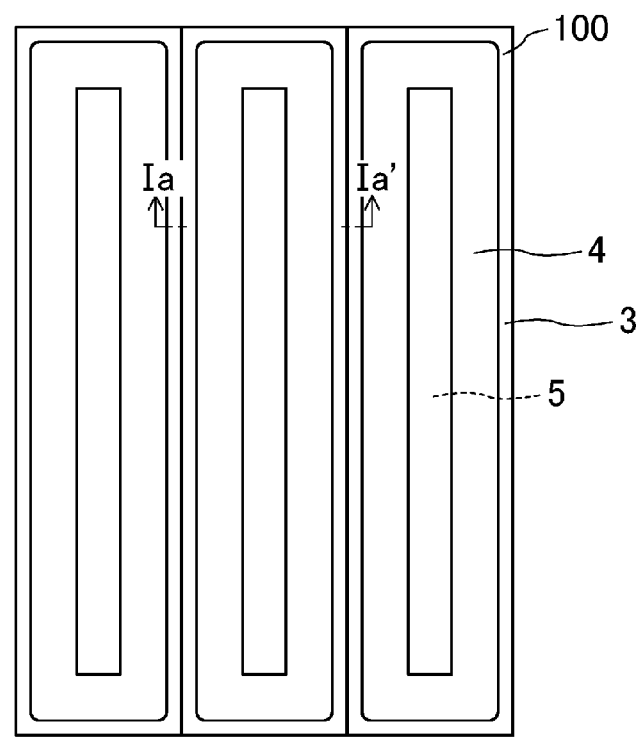

FIG. 1A schematically illustrates a cross-sectional configuration of one of the plurality of unit cells included in the semiconductor device 100. FIG. 1B schematically illustrates an exemplary configuration of the semiconductor device 100 viewed from above, specifically, the surfaces of silicon carbide layers of the plurality of unit cells (three unit cells in this embodiment). FIG. 1A is the cross-sectional view taken along the line Ia-Ia' in FIG. 1B. FIG. 1B illustrates an arrangement of body regions 3, source regions 4, and trenches 5 while omitting the other components. Although the illustrated trenches 5 each have a rectangular shape as viewed from above, each unit cell may have another shape (e.g., a square shape or a polygonal shape).

Each unit cell of the semiconductor device 100 includes a substrate 1. As the substrate 1, a silicon carbide substrate (a SiC substrate) of N-type (the first conductivity type) having a (0001) Si plane serving as the principal face can be used for example. However, the substrate 1 is not limited to this. A SiC substrate having a C plane serving as the principal face may be used as the substrate 1. The substrate 1 may have any polytype structure. In this embodiment, a 4H-SiC substrate is used as an example.

On the principal face of the substrate 1, a silicon carbide layer 2 which is, e.g., an epitaxial layer is formed.

The silicon carbide layer 2 includes a drift region 2d of the first conductivity type (N-type in this embodiment) formed on the principal face of the substrate 1, the body region 3 of the second conductivity type (P-type in this embodiment) formed on the drift region 2d (i.e. a first semiconductor region), and the source region 4 (i.e., a second semiconductor region) of the first conductivity type (N-type) formed in an upper portion of the body region 3. Here, the substrate 1 is of the first conductivity type (N-type), and has an impurity concentration higher than that of the drift region 2d.

In the illustrated embodiment, the source region 4 is enclosed with the body region 3 at the bottom face and the side faces. Here, the silicon carbide layer 2 is a silicon carbide layer formed by epitaxial growth. The silicon carbide layer 2, however, may be formed by implanting N-type or P-type impurity ions into a portion of the substrate 1 located near the principal face of the substrate 1.

In the silicon carbide layer 2, a trench 5 penetrates, from a principal face 52 (i.e. a Si plane), the body region 3 and the source region 4, and reaches the drift region 2d. In the embodiment of FIG. 1A, the trench 5 has a trench sidewall 50 which is perpendicular to the principal face 52 of the silicon carbide layer 2. The width of an upper portion of the trench 5 increases upwardly.

Thus, the trench 5 has a trench bottom 53, the trench sidewall 50, and a trench upper side face 51. The trench upper side face 51 is located between the trench sidewall 50 and a portion of the principal face 52 of the silicon carbide layer 2 surrounding the trench 5, and different from the trench sidewall 50 and the principal face 52 of the silicon carbide layer 2. The trench upper side face 51 may be substantially plane or rounded.

Note that the trench sidewall 50 may be oblique relative to the principal face 52 of the silicon carbide layer 2. If this is the case, the trench 5 has, in the upper portion, the trench upper side face 51 which is more oblique than the oblique trench sidewall 50. That is, the trench 5 is formed such that the width of its upper portion increases upwardly, as compared to the portion below the upper portion.

A trench bottom impurity region 7 of the second conductivity type (P-type) is formed in the trench 5 such that the trench bottom impurity region 7 covers a surface of the trench bottom 53. The upper face of the trench bottom impurity region 7 is downwardly convex (in other words, is concave). The trench bottom 53 corresponds to a portion of the upper face of the drift region 2d located under the trench 5. Since the trench bottom impurity region 7 covers the trench bottom 53, the trench bottom 53 corresponds to the interface between the drift region 2d and the trench bottom impurity region 7.

The upper face of the trench bottom impurity region 7 is located below the interface between the drift region 2d and the body region 3. On the trench sidewall 50, the distance H1 extending between an upper end of the trench bottom impurity region 7 and a bottom face of the body region 3 is preferably set to 0.1 μm or more, for example. Further, the trench sidewall 50 coincides with the side faces of the trench bottom impurity region 7.

A gate insulating film 8 covering at least the trench sidewall 50 and the trench bottom impurity region 7 is formed in the trench 5. In the embodiment of FIG. 1A, the gate insulating film 8 is also in contact with the trench upper side face 51. The gate insulating film 8 is, e.g., a silicon oxide film formed by thermal oxidation or a silicon oxide film containing nitrogen (N).

A gate electrode 9 is formed on the gate insulating film 8 in the trench 5. It is sufficient that the gate electrode 9 covers at least the body region 3. Here, for example, the trench 5 is filled with the gate electrode 9. Thus, the gate electrode 9 is insulated from the silicon carbide layer 2 by the gate insulating film 8.

A source electrode 10 shared by the source and the body is formed on the silicon carbide layer 2 such that the source electrode 10 is in contact with both of the body region 3 and the source region 4. Further, a drain electrode 11 is provided on the back face of the substrate 1.

The semiconductor device 100 includes the thus configured MISFETs having the trench gate structure.

When the source electrode 10 is connected to a ground potential and a bias which is negative relative to a threshold is applied to the gate electrode 9, each MISFET enters an accumulation state in which positive holes are induced in an area located between the source region 4 and the drift region 2d and near the interface between the body region 3 and the gate insulating film 8. Under this state, since the paths of electrons serving as conductive carriers are interrupted, no current is allowed to pass (the off state). In the off state, when a high voltage is applied between the drain electrode 11 and the source electrode 10 such that the drain electrode 11 is positive, the PN junction between the body region 3 and the drift region 2d is reverse-biased, and a depletion layer extends in the body region 3 and the drift region 2d, thereby maintaining the high voltage.

When a positive bias greater than the threshold is applied to the gate electrode 9, each MISFET enters an inversion state in which electrons are induced between the source region 4 and the drift region 2d and near the interface between the body region 3 and the gate insulating film 8, thereby causing an inversion layer to be formed. Consequently, the carriers flow through the source electrode 10, the source region 4, the inversion layer (not shown) extending in the body region 3 and being in contact with the gate insulating film 8, the drift region 2d, the substrate 1, and the drain electrode 11, in this order (the on state).

As will be detailed later in the description of a manufacturing method of the semiconductor device, the trench bottom impurity region 7 is formed by causing silicon carbide of an upper corner portion (an upper peripheral portion) of the trench 5 to move and cover the bottom of trench 5. Accordingly, the trench sidewall 50 of the trench 5 coincides with the side faces of the trench bottom impurity region 7 nearly without misalignment.

Thus, in each MISFET of the semiconductor device 100, it is ensured that the trench bottom impurity region 7 of the second conductivity type (P-type) covers the trench bottom 53. Therefore, even when a high voltage is applied between the source and the drain, an electric field to be applied to the trench bottom 53 can be reduced. Consequently, it is ensured that each MISFET withstands the high voltage, and damage to the MISFET can be prevented or reduced.

It is highly unlikely that the trench bottom impurity region 7 is allowed to extend outside the trench 5. This makes it possible to overcome a disadvantage of the conventional techniques: depletion occurs in a portion of the drift region 2d located between a P-type region extending from the bottom of the trench 5 toward the principal face 52 and the body region 3 (of P-type), and the depletion results in an increase in a parasitic resistance component (a JFET resistance component).

—Manufacturing Method of Semiconductor Device—

A manufacturing method of the illustrative semiconductor device of this embodiment will be described next.

Figure 2A:
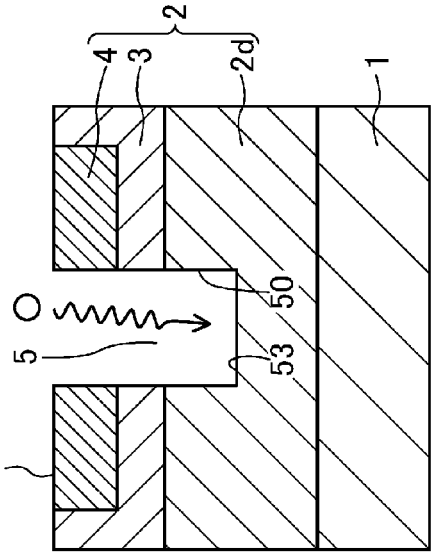
FIGS. 2A-2D illustrate steps of a method for manufacturing the illustrative semiconductor device.

First, a step illustrated in FIG. 2A is performed. In this step, the silicon carbide layer 2 including the drift region 2d, the body region 3, and the source region 4 is formed on the substrate 1.

As an example of the substrate 1, a 4H-silicon carbide substrate of the first conductivity type (N-type in this embodiment) having an off-angle of 4° relative to its (0001) Si plane is used. The silicon carbide layer 2 of N-type is epitaxially grown on the (0001) Si plane of the substrate 1. The silicon carbide layer 2 has a carrier concentration of $8 \times 10^{15}$ cm$^{-3}$ and a thickness of 12 μm, for example. As an N-type dopant, nitrogen is used for example.

Next, the P-type body region 3 is formed in a surface portion of the silicon carbide layer 2. The body region 3 has a carrier concentration of $2 \times 10^{18}$ cm$^{-3}$ and a thickness of 1.2 μm, for example. The body region 3 is formed by implanting P-type impurity ions (e.g. Al ions) into the silicon carbide layer 2, for example. In the silicon carbide layer 2, the potion where the body region 3 does not extend serves as the drift region 2d.

The body region 3 may be epitaxially grown on the N-type silicon carbide layer 2 while supplying a P-type dopant (e.g., trimethylaluminum).

Next, the N-type source region 4 is formed in an upper portion of the body region 3. The source region 4 has a carrier concentration of $5\times10^{19}$ cm$^{-3}$ and a thickness of 0.6 µm, for example. The source region 4 is formed by implanting N-type impurity ions (e.g., N ions) into the body region 3 with the use of a mask layer (not shown) formed on the silicon carbide layer 2 and made of, e.g., a silicon oxide or polysilicon.

Thereafter, annealing is performed in an inert atmosphere and at 1700° C. for about 30 minutes, for example. This annealing activates the impurities implanted in the body region 3 and the source region 4.

Figure 2C:
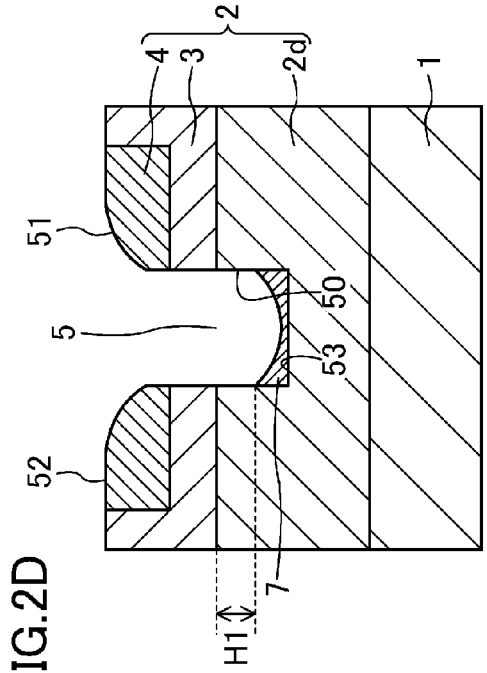
Figure 2B:
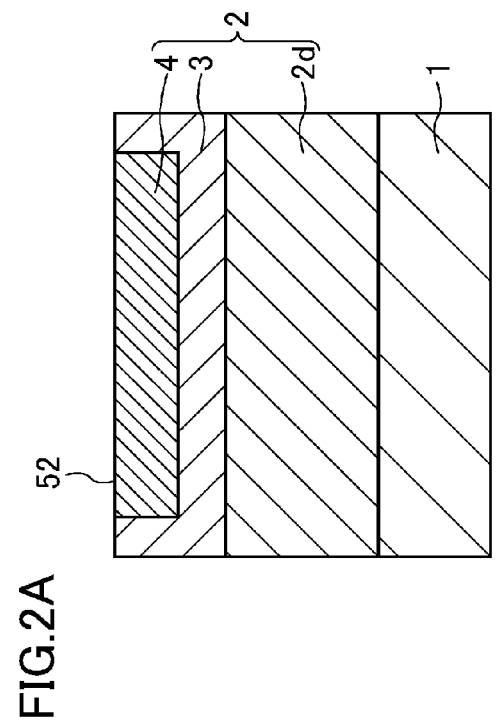

Next, as illustrated in FIG. 2B, the trench 5 is formed in the silicon carbide layer 2. In this embodiment, the trench 5 is formed such that the trench 5 penetrates the source region 4 and the body region 3, and has the trench bottom 53 located in the drift region 2d.

To form the trench 5, a mask layer (not shown) such as a plasma oxide film is formed on part of the source region 4, and then, reactive ion etching (RIE) is performed using the mask layer as a mask. In this manner, the trench 5 which has, e.g., a depth of 1.5 µm and a width of 1 µm is formed in the silicon carbide layer 2.

In the embodiment illustrated in FIG. 2B, the trench sidewall 50 of the trench 5 is substantially perpendicular to the principal face of the substrate 1. The trench sidewall 50, however, may be oblique relative to the direction of a normal to the principal face of the substrate 1. In other words, the trench 5 may have a tapered or reverse-tapered shape of which the width varies along the height.

Figure 2D:
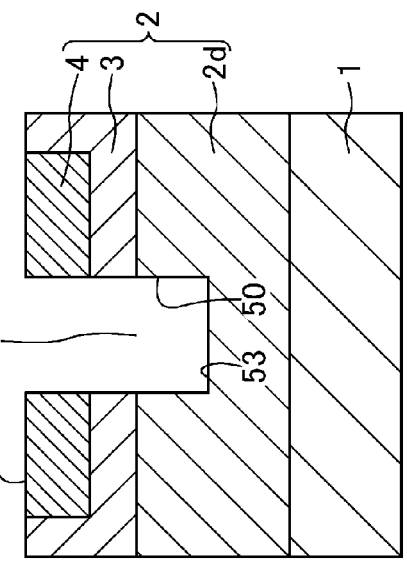

Next, as illustrated in FIGS. 2C and 2D, the trench bottom impurity region 7 which is of the second conductivity type (P-type in this embodiment) and covers the trench bottom 53 is formed by causing part of silicon carbide of an upper corner portion of the trench 5 to move to be placed on the trench bottom 53 while doping the silicon carbide with a dopant 16 of the second conductivity type.

Specifically, the substrate 1 having the silicon carbide layer 2 (including the source region 4, the body region 3, and the drift region 2d) formed thereon is annealed in an atmosphere of argon (Ar) gas containing a P-type dopant gas (e.g., trimethylaluminum or diborane) and at 1530° C. and 200 mbar (200 hPa). The annealing time is five minutes, for example.

This annealing causes part of silicon carbide of the upper corner portion of the trench 5 to move to be placed on the trench bottom 53. At this time, the silicon carbide having moved is doped with the P-type dopant 16 contained in the annealing atmosphere, and consequently, the trench bottom impurity region 7 which is a P-type region is formed. The carrier concentration of the trench bottom impurity region 7 can be adjusted by changing a flow rate of the dopant 16 and the annealing conditions. In this embodiment, the carrier concentration of the trench bottom impurity region 7 is from the range of $10^{16}$ cm$^{-3}$ to the range of $10^{18}$ cm$^{-3}$, for example.

It is possible to cause the silicon carbide of the trench bottom impurity region 7 to be lattice-matched with the silicon carbide of the trench bottom 53 and the trench sidewall 50, and to have few crystal defects and high crystal quality. It is presumed that the movement of silicon carbide during formation of the trench bottom impurity region 7 is caused by surface diffusion. However, the present disclosure is not limited to the case where surface diffusion actually causes the movement of silicon carbide.

Since part of the silicon carbide of the upper corner portion of the trench 5 moves and forms the trench bottom impurity region 7, the upper face of the source region 4 is likely to become downwardly oblique toward the inside of the trench 5 in the upper peripheral portion of the trench 5. In addition, the upper face of the source region 4 (i.e., the upper corner portion of the trench 5) is likely to have a rounded shape.

Further, the upper face of the trench bottom impurity region 7 is likely to be formed in a roundly concave plane. The upper face is curved and has a curvature radius of about 0.2-0.3 µm, for example.

The annealing can eliminate damage to the crystals on the surface of the trench 5 caused by the RIE performed to form the trench 5. Further, if a sub-trench (a portion further recessed by a large amount of etching on the trench bottom and near the sidewall of the trench) has been formed in a corner portion of the trench bottom 53, the sub-trench is filled with silicon carbide caused to move during the annealing and becomes negligible.

The annealing can form the trench bottom impurity region 7 in a shape which is in contact only with part of a lower portion of the trench sidewall 50 and covers the upper face of the trench bottom 53.

After the annealing in the atmosphere containing argon (Ar) gas and the dopant 16, annealing in a hydrogen atmosphere may be performed. During this annealing, hydrogen etches and removes an unnecessary P-type region which can have been formed on the trench sidewall 50 in the formation of the trench bottom impurity region 7. In this manner, a current path is ensured and a rise in the on-resistance can be reduced.

To ensure the current path, it is desirable that the upper end of the trench bottom impurity region 7 is located below the interface between the body region 3 and the drift region 2d, and the dimension H1 between the upper end and the interface is equal to or larger than a predetermined value (e.g., 0.1 µm).

The conditions of the annealing are not limited those described above. For example, the annealing may be performed in an atmosphere of an inert gas such as argon gas, a hydrogen atmosphere, an atmosphere of a chlorine-based gas, or an atmosphere containing a mixture of the forgoing gases. (In any case, the atmosphere is caused to contain the dopant 16.) It is preferable, however, to perform the annealing in an argon gas atmosphere.

Although the annealing temperature is not particularly limited, it is preferable to perform the annealing at a temperature equal to or higher than 1500° C. and equal to or lower than 1600° C., for example. At a temperature equal to or higher than 1500° C., it is possible to cause silicon carbide to move to form the trench bottom impurity region 7 within a short time of one hour or less. At a temperature equal to or lower than 1600° C., it is possible to reduce occurrence of severe roughness such as step bunching and Si missing on the surface of the silicon carbide layer 2. It is desirable to adjust appropriately the specific conditions of the annealing such that the depth and the width of the trench 5 will be within tolerance determined in view of device design.

Further, it is sufficient to change the annealing temperature in accordance with the type of the substrate being used. For example, if a silicon substrate is used, the annealing temperature may be set lower than a temperature at which a silicon carbide substrate is annealed.

Figure 3A:
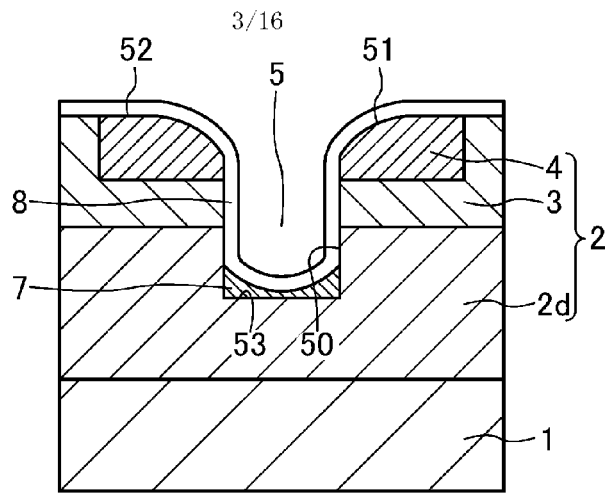
FIGS. 3A-3C illustrate steps subsequent to the step of FIG. 2D of the method for manufacturing the illustrative semiconductor device.

Next, as illustrated in FIG. 3A, the gate insulating film 8 covering the trench sidewall 50, the upper face of the trench bottom impurity region 7, and the trench upper side face 51 is formed.

To form the gate insulating film 8, the substrate 1 above which the trench 5 has been formed is washed, and then, placed in a thermal oxidation furnace, where the substrate 1 is subjected to processing in a dry oxidation atmosphere at 1200° C. for half an hour. In this manner, a silicon oxide film (a thermal oxide film) serving as the gate insulating film 8 is formed on the trench sidewall 50, the upper face of the trench bottom impurity region 7, and the trench upper side face 51.

Figure 3B:
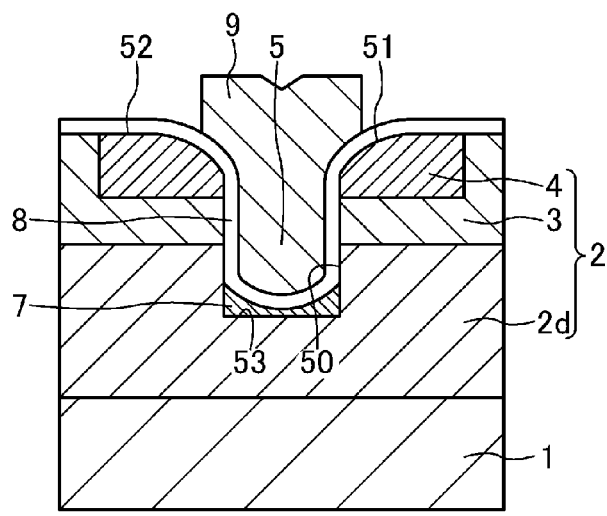

Next, as illustrated in FIG. 3B, the gate electrode 9 is formed such that the gate electrode 9 extends in the trench 5, above the upper surface of the silicon carbide layer 2, and on the gate insulating film 8.

Specifically, a deposit of phosphorus (P)-doped polysilicon having a thickness of, e.g., 1000 nm is formed on the entire surface of the wafer by low pressure CVD (LP-CVD). Next, the wafer is subjected to rapid thermal annealing (RTA) in, e.g., an inert atmosphere at 1000° C. for 60 seconds to activate phosphorus. Thereafter, a mask layer (not shown) such as a resist having an opening corresponding to the portion other than the trench 5 is formed. The polysilicon layer is then etched by RIE, thereby forming the gate electrode 9. It is sufficient that the gate electrode 9 has a shape covering at least the sidewall of the body region 3. The gate electrode 9 is not limited to the shape illustrated in FIG. 3B, and may occupy part of the inside of the trench 5 for example.

Figure 3C:
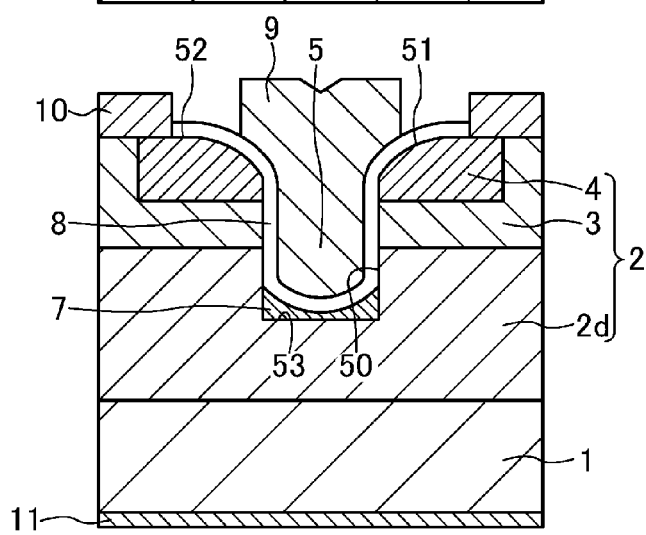

Next, as illustrated in FIG. 3C, the source electrode 10 is formed such that the source electrode 10 is in contact with the body region 3 and the source region 4. The source electrode 10 is formed on the upper surface of the silicon carbide layer 2 so as to extend on the body region 3 and the source region 4.

Specifically, an interlayer insulating film (not shown) covering the silicon carbide layer 2 and the gate electrode 9 is formed first. Next, an opening through which part of the source region 4 and part of the body region 3 are exposed is formed in the interlayer insulating film. A conductive film (e.g. a metal film of Ti) is formed in this opening, and annealing is performed as necessary. In this manner, the source electrode 10 being in ohmic contact with the source region 4 and the body region 3 is obtained.

Further, the drain electrode 11 is formed on the back face (the face opposite to the principal face) of the substrate 1.

In this manner, each of the unit cells of the semiconductor device, which is a MISFET having a trench gate structure, can be obtained.

According to this manufacturing method, the trench bottom impurity region 7 can be formed so as to cover the trench bottom 53 in a self-aligned manner. Accordingly, occurrence of misalignment is prevented, which can surely reduce concentration of electric field on the trench bottom 53 and can prevent dielectric breakdown of the gate insulating film 8 on the trench bottom 53 and a decrease in reliability of the gate insulating film 8.

Further, since the trench bottom impurity region 7 is formed by causing silicon carbide to move into the trench 5, it is possible to make the width of the trench bottom impurity region 7 equivalent to the width of the trench 5. Accordingly, it is possible to reduce depletion in the N-type region between the P-type body region and the P-type region formed on the trench bottom, and a parasitic resistance component (a JFET resistance component) which can be produced by the depletion.

Furthermore, according to this manufacturing method, since the trench bottom impurity region 7 is formed by performing the annealing, the trench bottom 53 does not suffer damage which could be caused by ion implantation. In addition, since this manufacturing method enables formation of the trench bottom impurity region 7 at a temperature lower than a temperature of activation annealing in ion plantation, the roughness on the wall of the trench 5 can be reduced as compared to a case where ion implantation is performed.

Moreover, since the trench bottom impurity region 7 is epitaxially grown on, and lattice-matched with the trench bottom 53, the trench bottom impurity region 7 has high quality crystallinity. Consequently, the gate insulating film 8 formed on the trench bottom impurity region 7 can be improved in reliability.

As the gate insulating film 8, a nitrogen-containing silicon oxide film may be formed instead of the silicon oxide film. Since use of the nitrogen-containing silicon oxide film reduces interface state density at the interface between the gate insulating film 8 and the body region 3, improvement of channel mobility is expected.

Further, the gate insulating film 8 may include a film other than the thermal oxide film. A deposited film formed by, e.g., chemical vapor deposition (CVC) or sputtering may be used as the gate insulating film 8.

(Variation)

A semiconductor device according to a variation of the embodiment is described below with reference to the drawings.

Figure 4A:
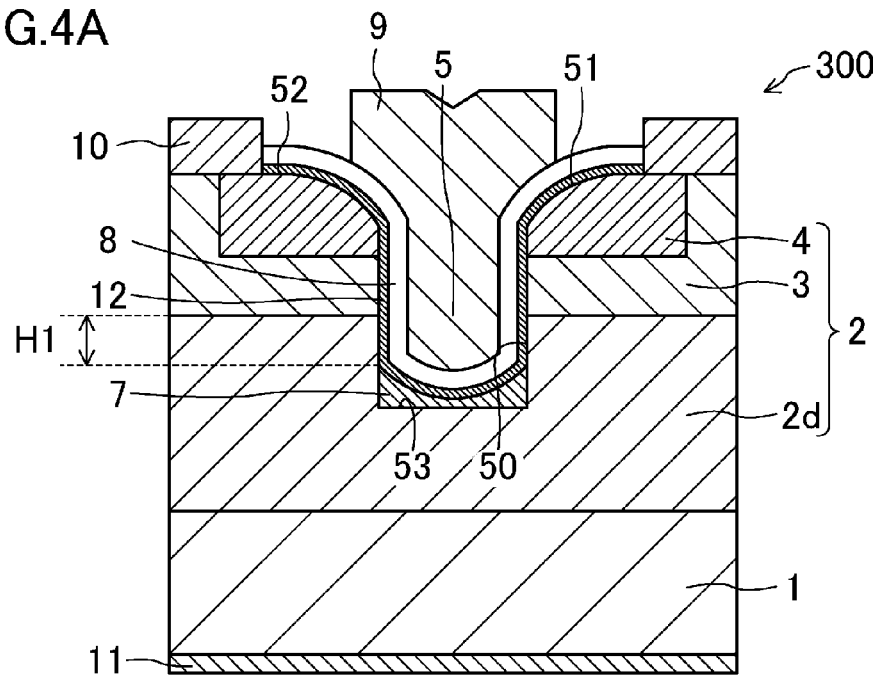
FIGS. 4A and 4B are respectively a cross-sectional view and a plan view which schematically illustrate a structure of a semiconductor device according to a variation of the first embodiment of the present disclosure.
Figure 4B:
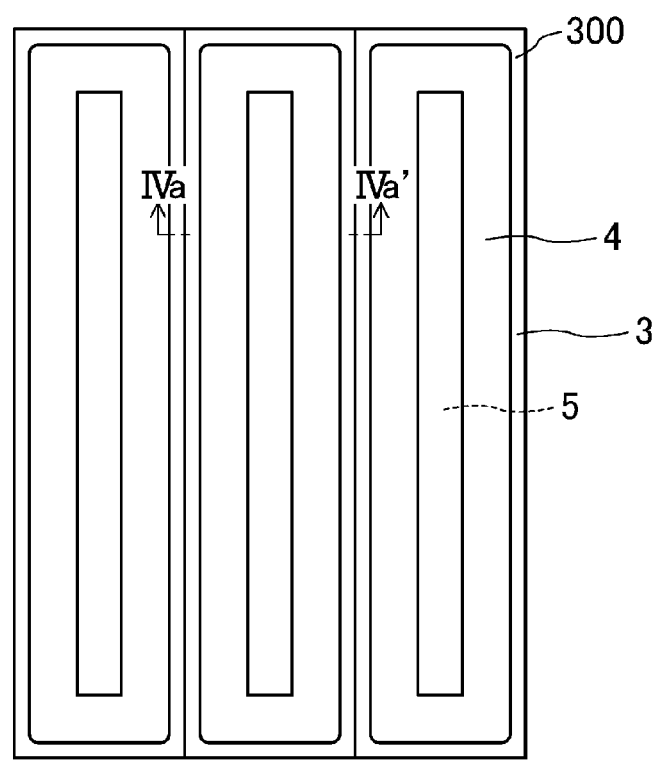

FIG. 4A schematically illustrates a cross-sectional configuration of one of a plurality of unit cells included in a semiconductor device 300 according to this variation. FIG. 4B schematically illustrate an exemplary configuration of the semiconductor device viewed from above, specifically, the surfaces of silicon carbide layers of the plurality of unit cells (three unit cells in this variation). FIG. 4A is the cross-sectional view taken along the line IVa-IVa' in FIG. 4B. In FIGS. 4A and 4B, components which are the same as those of the semiconductor device 100 illustrated in FIGS. 1A and 1B are denoted by the same reference characters. The following description will be mainly focused on differences between the semiconductor devices of the embodiment and the variation.

As illustrated in FIG. 4A, each cell of the semiconductor device 300 of the variation includes, between the trench sidewall 50 and the gate insulating film 8, a channel layer 12 made of silicon carbide of the first conductivity type (N-type in this variation). The channel layer 12 has a carrier concentration of $1 \times 10^{18}$ cm$^{-3}$ and a thickness of 20 nm, for example. The carrier concentration (the impurity concentration) of the channel layer 12 is preferably higher than the carrier concentrations of the drift region 2d and the trench bottom impurity region 7.

The channel layer 12 is effective at reducing depletion in the N-type region (the drift region 2d) between the P-type body region 3 and the P-type trench bottom impurity region 7. Accordingly, this variation can reduce a parasitic resistance component (a JFET resistance component) more surely than the configuration illustrated in FIGS. 1A and 1B does.

The channel layer 12 may have either a single layer structure or a multilayer structure, provided that any layer included in the channel layer 12 has a carrier concentration higher than that of the drift region 2d. It is sufficient to adjust the thickness of the channel layer 12 as appropriate in accordance with a design value of a gate threshold voltage.

A MOSFET including the channel layer 12 of the first conductivity type (N-type in this variation) is called accumulation-type MOSFET, and operation of such an accumulation-type MOSFET is partially different from operation of a MOSFET which does not include the channel layer 12 (see FIGS. 1A and 1B).

For example, in the off state where a bias which is negative relative to the threshold is applied to the gate electrode 9, since the MOSFET enters a depletion state in which the PN junction between the channel layer 12 and the body region 3 causes depletion to occur in the channel layer 12, no current is allowed to flow. In the on state where a positive bias greater than the threshold is applied to the gate electrode 9, since the MOSFET enters an accumulation state in which a high density of electrons is accumulated in the channel layer 12, a current is allowed to flow.

A manufacturing method of the semiconductor device 300 of this variation is described next.

Figure 5A:
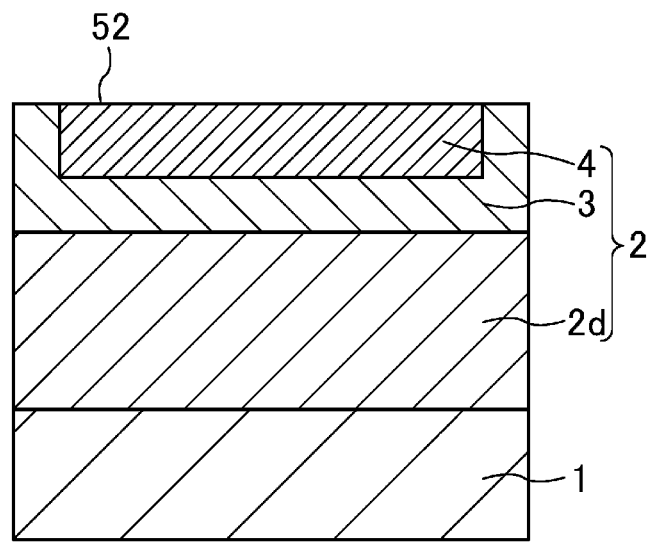
FIGS. 5A and 5B illustrate steps of a method for manufacturing the semiconductor device of the variation.
Figure 5B:
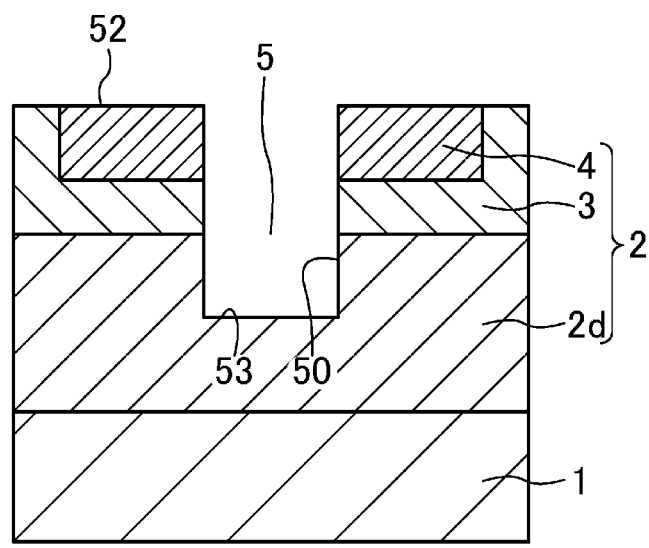

First, as illustrated in FIG. 5A, the silicon carbide layer 2 including the drift region 2d, the body region 3, and the source region 4 is formed on the substrate 1. Subsequently, as illustrated in FIG. 5B, the trench 5 is formed such that the trench 5 penetrates the source region 4 and the body region 3 of the silicon carbide layer 2, and has the trench bottom 53 located in the drift region 2d. It is sufficient to perform these steps in a manner similar to the steps described with reference to FIGS. 2A and 2B in the manufacturing method of the semiconductor device 100.

Figure 6A:
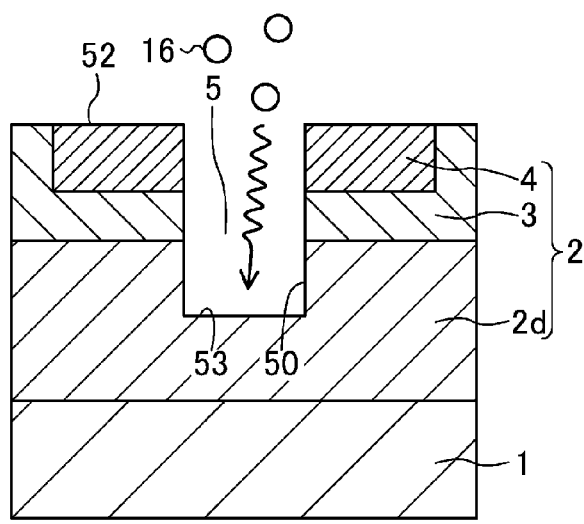
FIGS. 6A-6C illustrate steps subsequent to the step of FIG. 5B of the method for manufacturing the semiconductor device of the variation.
Figure 6B:
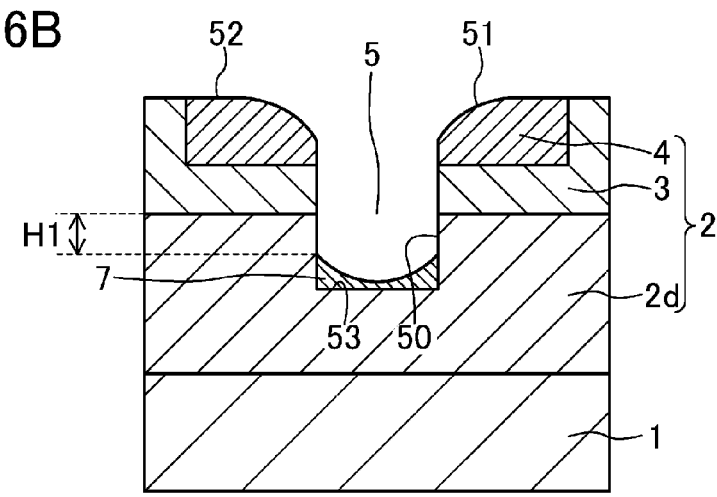

Next, as illustrated in FIGS. 6A and 6B, the trench bottom impurity region 7 which is of the second conductivity type (P-type in this variation) and covers the trench bottom 53 is formed in the following manner: annealing is performed in, e.g., an atmosphere of argon gas containing a P-type dopant gas, thereby causing part of silicon carbide of an upper corner portion of the trench 5 to move to be placed on the trench bottom 53 while doping the silicon carbide with the dopant 16. More specifically, this step is sufficiently performed in a manner similar to the step described with reference to FIGS. 2C and 2D in the manufacturing method of the semiconductor device 100.

Figure 6C:
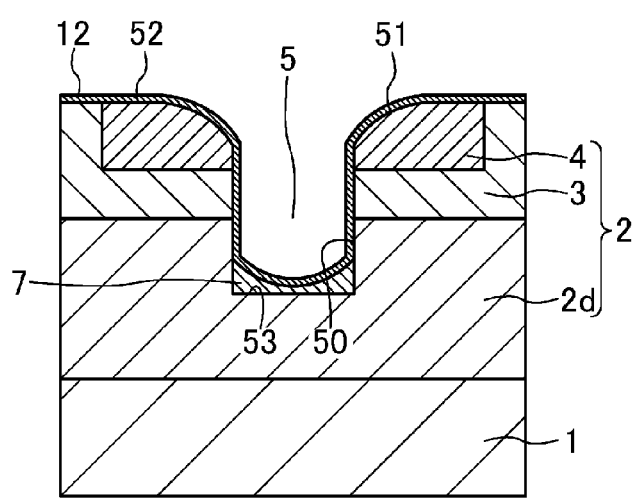

Next, as illustrated in FIG. 6C, the channel layer 12 made of silicon carbide and serving as a channel layer is formed inside the trench 5. Specifically, the channel layer 12 is formed so as to cover the trench sidewall 50, the upper face of the trench bottom impurity region 7, the trench upper side face 51, the upper face of the source region 4 surrounding the trench 5, and the upper face of the body region 3. The channel layer 12 is made of silicon carbide of the first conductivity type (N-type in this variation) having a carrier concentration of $1 \times 10^{18}$ cm$^{-3}$.

The channel layer 12 is formed by using CVD apparatus for example. The CVD apparatus is supplied with a silicon-based gas (e.g. silane gas), a carbon-based gas (e.g. propane gas), and a dopant gas (e.g. Nitrogen gas if N-type is desired), and the CVD apparatus is heated to a temperature between 1500° C. and 1600° C. inclusive. However, the present disclosure is not limited to these conditions. For example, the channel layer 12 can be epitaxially grown in a wider temperature range (e.g., between 1450° C. and 1650° C. inclusive) in a sufficient manner.

Note that, after forming the trench bottom impurity region 7 as illustrated in FIGS. 6A and 6B, the channel layer 12 illustrated in FIG. 6C can be grown in the same apparatus in a continuous manner.

It is also possible to form, instead of the channel layer 12, an N-type channel layer by implanting ions into the trench sidewall 50. It is, however, more preferable to form the channel layer 12 by epitaxial growth because damage to crystals is reduced.

Figure 7A:
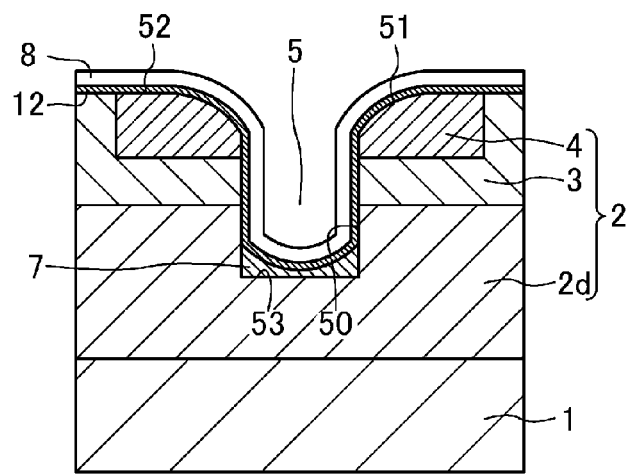
FIGS. 7A-7C illustrate steps subsequent to the step of FIG. 6C of the method for manufacturing the semiconductor device of the variation.

Next, as illustrated in FIG. 7A, the gate insulating film 8 covering the channel layer 12 in and around the trench 5 is formed. The gate insulating film 8 may be a silicon oxide film formed by thermal oxidation, a nitrogen-containing silicon oxide film, or a deposited film formed by CVD or sputtering. The gate insulating film 8 is sufficiently formed in a manner similar to the step described with reference to FIG. 3A in the manufacturing method of the semiconductor device 100.

Figure 7B:
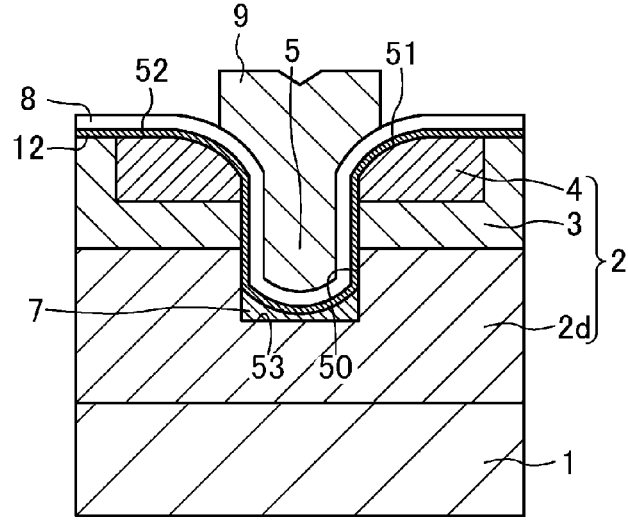

Next, as illustrated in FIG. 7B, the gate electrode 9 is formed such that the gate electrode 9 extends in the trench 5, above the upper surface of the silicon carbide layer 2, and on the gate insulating film 8. For example, after forming a deposited film of phosphorus (P)-doped polysilicon by LP-CVD, phosphorus is activated by RTA, and a portion of the film is etched and removed so as to leave a predetermined portion. More specifically, the gate electrode 9 is sufficiently formed in a manner similar to the step described with reference to FIG. 3B in the manufacturing method of the semiconductor device 100.

Figure 7C:
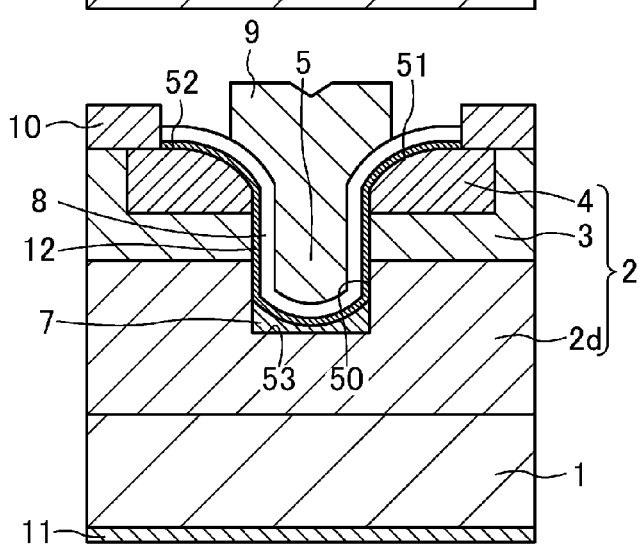

Thereafter, as illustrated in FIG. 7C, the source electrode 10 is formed such that the source electrode 10 extends on the body region 3 and the source region 4. Further, the drain electrode 11 is formed on the back face (the face opposite to the principal face) of the substrate 1. The source electrode 10 and the drain electrode 11 are sufficiently formed in a manner similar to the step described with reference to FIG. 3C in the manufacturing method of the semiconductor device 100.

Each of the unit cells of the semiconductor device 300 according to this variation is thus manufactured. In this variation, the trench bottom impurity region 7 is also formed by causing silicon carbide of the upper corner portion of the trench 5 to move to cover the trench bottom 53 while doping the silicon carbide with the dopant 16. Accordingly, the semiconductor device 300 offers advantages similar to those offered by the semiconductor device 100. Specifically, the trench bottom impurity region 7 formed in a self-aligned manner relative to the trench 5 without allowing misalignment, which can prevent dielectric breakdown of the gate insulating film 8 on the trench bottom 53 and a decrease in reliability of the gate insulating film 8. It is also possible to reduce depletion in the N-type region between the P-type body region and the P-type region formed on the trench bottom, and a parasitic resistance component (a JFET resistance component) which can be produced by the depletion. In addition, the channel layer 12 can reduce production of the parasitic resistance component (the JFET resistance component) more surely, as described above.

In the above embodiment and the variation, the drift region 2d is of N-type whereas the trench bottom impurity region 7 is of P-type. On the contrary, the semiconductor devices may include the drift region 2d of P-type and the trench bottom impurity region 7 of N-type. In other words, the above-described semiconductor devices may be configured such that the first conductivity type is P-type and the second conductivity type is N-type. If this is the case, to form the trench bottom impurity region 7, silicon carbide is doped with an N-type dopant gas such as nitrogen or phosphine.

In the above embodiment and the variation, the vertical MISFETs having a trench gate structure have been described as typical examples. It is, however, possible to apply, to semiconductor devices of other types the structure in which the trench, the first semiconductor region of the first conductivity type, and the trench bottom impurity region of the second conductivity type are combined, the manufacturing method of the structure, and in particular, the method for forming the trench bottom impurity region.

For example, the method for forming the trench bottom impurity region of the present disclosure may be applied to a P-type layer in a guard ring of a transistor or a diode, a P-type layer of a merged PiN and Shottky bather (MPS) diode, a P-type layer of a junction-barrier Schottky (JBS) diode, and the like. Since the method of the present disclosure does not employ ion implantation and CVD which are performed in conventional methods, the application of the method of the present disclosure is advantageous in that a P-type layer having high crystallinity and high quality can be selectively formed on a trench bottom, and is expected to improve reliability of the semiconductor device.

Here, the MPS diode refers to a diode designed to take advantage of the strengths of a PiN diode and a Schottky barrier diode. The JBS diode is capable of reducing a leak current of a Schottky bather by using a depletion layer at pn junction in addition to using the Schottky barrier. The JBS diode utilizes the pn junction to reduce the leak current. On the other hand, the MPS diode differs from the JBS diode in that, in the MPS diode, the current also flows to the pn junction, and thereby enabling obtainment of a large forward current at a relatively high forward voltage. Both of the MPS diode and the JBS diode have a structure in which a Schottky electrode is electrically connected to a P-type layer and an N-type layer.

Figure 8:
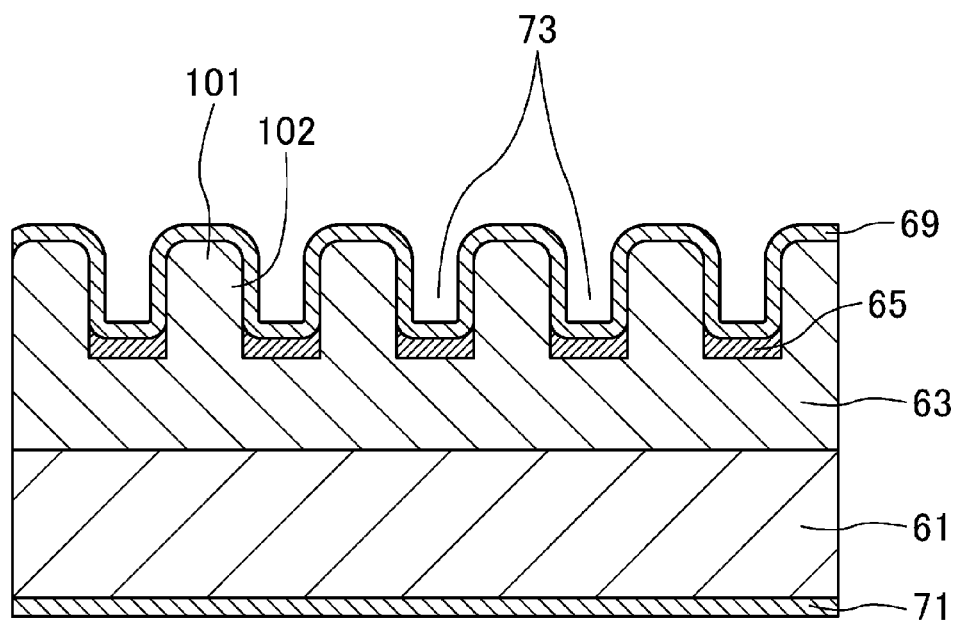
FIG. 8 is a cross-sectional view schematically illustrating a structure of an example of a diode to which the structure of the semiconductor device of the first embodiment is applied.

FIG. 8 is a cross-sectional view schematically illustrating a structure of a JBS diode to which the technique of the present disclosure is applied. The structure of FIG. 8 includes a substrate 61 of the first conductivity type (N-type in this example) and a semiconductor layer 63 of the first conductivity type (N-type) formed on the substrate 61. A plurality of trenches 73 are arranged in the semiconductor layer 63, and trench bottom impurity regions 65 of the second conductivity type (P-type in this example) are each formed so as to cover a corresponding one of the bottoms of the trenches 73. Further, a first electrode 69 extends in the trenches 73 and on the semiconductor layer 63. The substrate 61 has a second electrode 71 formed on its back face. Part of an upper corner portion of each trench 73 is removed, and the upper surface of the semiconductor layer 63 is rounded for example. The upper face of each trench bottom impurity region 65 is curved and downwardly convex for example. The lower face of each trench bottom impurity region 65 may be flat, be extend in a sub-trench, or be rounded, for example.

Here, the first electrode 69 is made of a metal which causes a Schottky barrier to be formed on the semiconductor layer 63. For example, when the semiconductor layer 63 is made of 4H-SiC, Ti is selected as a material for the first electrode 69.

In this structure, the bottoms of the trenches 73 are protected by the trench bottom impurity regions 65. Regions 101 which are located in an upper portion of the semiconductor layer 63 and in which no trenches extend and regions 102 of the semiconductor layer 63 each of which is located near corresponding one of the sidewalls of the trenches 73 are in Schottky junction with the first electrode 69. Thus, by causing the first electrode 69 to serve as an anode and the second electrode 71 to serve as a cathode, the semiconductor device of FIG. 8 functions as a JBS diode. When a forward bias is applied to the JBS diode, a diode current flows from the first electrode 69 to the second electrode 71 through the regions 101 and 102. On the other hand, when a reverse bias is applied to the JBS diode, since the reverse bias is applied to the pn junctions formed by the trench bottom impurity regions 65 and the semiconductor layer 63, depletion layers extend from the pn junctions. These depletion layers overlap depletion layers extending from adjacent ones of the trench impurity regions 65, thereby advantageously interrupt a leak current at the Schottky junction of the regions 101 and 102.

The MPS diode can be produced by, e.g., adjusting a carrier concentration of the trench bottom impurity regions 65 or annealing conditions of the first electrode 69 such that the trench bottom impurity regions 65 and the first electrode 69 are in ohmic contact.

In order to build this structure, the above-described method for forming the trench bottom impurity region 7 of, e.g., the semiconductor device 100 can be utilized. Specifically, after forming the trenches 73 in the semiconductor layer 63, annealing is performed in an argon atmosphere containing a P-type dopant gas (e.g., trimethylaluminum or diborane). This annealing causes semiconductor elements of the upper corner portions of the trenches 73 to move to the bottoms of the trenches 73 while doping the semiconductor elements with the dopant, thereby forming the trench bottom impurity regions 65 of P-type. Thus, the trench impurity regions 65 can be formed in a self-aligned manner with respect to the trenches 73.

Second Embodiment

—Structure of Semiconductor Device—

An illustrative semiconductor device 100a according to a second embodiment of the present disclosure and a manufacturing method of the semiconductor device 100a will be described below with reference to the drawings.

For example, the semiconductor device is a silicon carbide semiconductor device, and specifically, includes a plurality of unit cells each of which is a SiC-metal-insulator-semiconductor field-effect transistor (SiC-MISFET) having a trench gate structure.

Figure 9A:
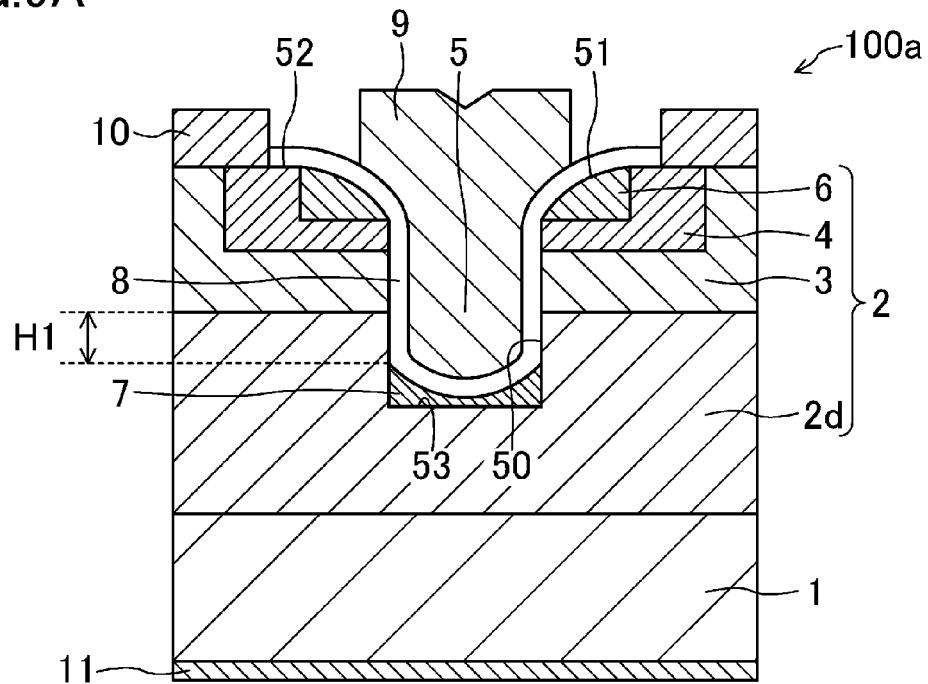
FIGS. 9A and 9B are respectively a cross-sectional view and a plan view which schematically illustrate a structure of an illustrative semiconductor device according to a second embodiment of the present disclosure.
Figure 9B:
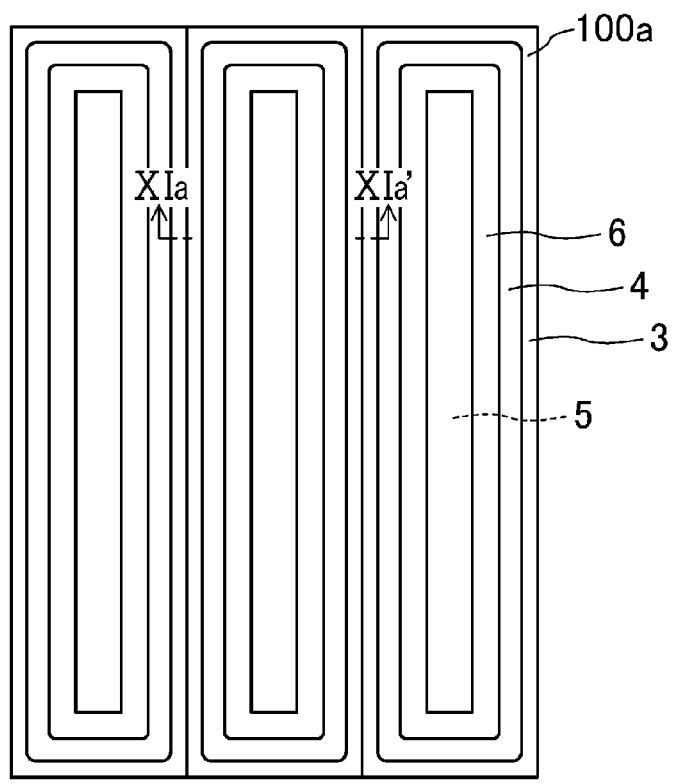

FIG. 9A schematically illustrates a cross-sectional configuration of one of the plurality of the unit cells included in the semiconductor device 100a. FIG. 9B schematically illustrates an exemplary configuration of the semiconductor device 100a viewed from above, specifically, the surfaces of silicon carbide layers of the plurality of unit cells (three unit cells in this case). FIG. 9A is the cross-sectional view taken along the line Xia-XIa' in FIG. 9B. FIG. 9B illustrates an arrangement of body regions 3, source regions 4, trench top impurity regions 6, and trenches 5 while omitting the other components. Although the illustrated trenches 5 have a rectangular shape as viewed from above, each unit cell may have another shape (e.g., a square shape or a polygonal shape).

Each unit cell includes a substrate 1. As the substrate 1, a silicon carbide substrate (a SiC substrate) of N-type (the first conductivity type) having a (0001) Si plane serving as the principal face can be used for example. However, the substrate 1 is not limited to this. A SiC substrate having a C plane serving as the principal face may be used as the substrate 1. The substrate 1 may have any polytype structure. In this embodiment, a 4H-SiC substrate is used as an example.

On the principal face of the substrate 1, a silicon carbide layer (a semiconductor layer) 2 which is, e.g., an epitaxial layer is formed. The silicon carbide layer 2 includes a drift region (a first semiconductor region) $2d$ of the first conductivity type (N-type in this embodiment) formed on the principal face of the substrate 1, the body region 3 of the second conductivity type (P-type in this embodiment) formed on the drift region $2d$, the source region (a second semiconductor region) 4 of the first conductivity type (N-type) formed in an upper portion of the body region 3, and the trench top impurity region 6 of the second conductivity type formed in an upper portion (i.e., an upper face portion) of the source region 4. Here, the substrate 1 is of the first conductivity type (N-type), and has an impurity concentration higher than that of the drift region $2d$.

In the illustrated embodiment, the source region 4 is enclosed with the body region 3 at the bottom face and the side faces. Here, the silicon carbide layer 2 is a SiC layer formed by epitaxial growth. The silicon carbide layer 2, however, may be formed by implanting N-type or P-type impurity ions into a portion of the substrate 1 located near the principal face of the substrate 1.

In the silicon carbide layer 2, a trench 5 penetrates, from a principal face 52 (i.e. a Si plane), the trench top impurity region 6, the body region 3, and the source region 4, and reaches the drift region $2d$. In the embodiment of FIG. 9A, the trench 5 has a trench sidewall 50 which is perpendicular to the principal face 52 of the silicon carbide layer 2. The width of an upper portion of the trench 5 increases upwardly. The trench top impurity region 6 is located in an upper peripheral portion of the trench 5. The upper face of the trench top impurity region 6 is downwardly oblique toward the inside of the trench 5.

The trench 5 has a trench bottom 53, the trench sidewall 50, and a trench upper side face 51 corresponding to the upper face of the trench top impurity region 6. The trench upper side face 51 is located between the trench sidewall 50 and a portion of the principal face 52 of the silicon carbide layer 2 surrounding the trench 5, and different from the trench sidewall 50 and the principal face 52 of the silicon carbide layer 2. The trench upper side face 51 may be substantially plane or rounded.

Note that the trench sidewall 50 may be oblique relative to the principal face 52 of the silicon carbide layer 2. If this is the case, the trench 5 has, in the upper portion, the trench upper side face 51 which is more oblique than the oblique trench sidewall 50. That is, the trench 5 is formed such that the width of its upper portion increases upwardly, as compared to the portion below the upper portion.

A trench bottom impurity region 7 of the second conductivity type (P-type) is formed in the trench 5 such that the trench bottom impurity region 7 covers the upper surface of the trench bottom 53. The upper face of the trench bottom impurity region 7 is downwardly convex (in other words, is concave). The trench bottom 53 corresponds to a portion of the upper face of the drift region 2d located under the trench 5. Since the trench bottom impurity region 7 covers the trench bottom 53, the trench bottom 53 corresponds to the interface between the drift region 2d and the trench bottom impurity region 7.

The trench top impurity region 6 has an impurity concentration (a carrier concentration) higher than an impurity concentration (a carrier concentration) of the trench bottom impurity region 7. It is preferable that the impurity concentration (the carrier concentration) of the trench top impurity region 6 is higher than an impurity concentration (a carrier concentration) of the source region 4.

The upper face of the trench bottom impurity region 7 is located below the interface between the drift region 2d and the body region 3. On the trench sidewall 50, the distance H1 extending between an upper end of the trench bottom impurity region 7 and the bottom face of the body region 3 is preferably set to 0.1 μm or more, for example. Further, the trench sidewall 50 coincides with the side faces of the trench bottom impurity region 7.

A gate insulating film 8 covering at least the trench sidewall 50 and the trench bottom impurity region 7 is formed in the trench 5. In the embodiment of FIG. 9A, the gate insulating film 8 is also in contact with the trench upper side face 51, i.e., the upper face of the trench top impurity region 6 and a portion of the upper face of the source region 4. The gate insulating film 8 is, e.g., a silicon oxide film formed by thermal oxidation or a silicon oxide film containing nitrogen (N).

A gate electrode 9 is formed on the gate insulating film 8 in the trench 5. Here, for example, the trench 5 is filled with the gate electrode 9. Thus, the gate electrode 9 is insulated from the silicon carbide layer 2 by the gate insulating film 8.

A source electrode 10 shared by the source and the body is formed on the silicon carbide layer 2 such that the source electrode 10 is in contact with both of the body region 3 and the source region 4. Further, a drain electrode 11 is provided on the back face of the substrate 1.

As illustrated in FIG. 9B, in the semiconductor device 100a of this embodiment, the trench top impurity region 6 surrounds the trench 5 having a rectangular shape as viewed from above. Areas near the short sides of the trench 5 (in FIG. 9B, the areas near the upper and lower ends of each trench 5) may be configured not to operate as an element such as a transistor by implanting a high concentration of a P-type impurity such that the P-type impurity reaches the drift region 2d. If this is the case, it is sufficient that the trench top impurity region 6 extends along the long sides of the trench 5. In a case where the trench 5 has another shape as viewed from above, it is also sufficient that the trench top impurity region 6 is formed near a portion of the trench 5 serving as an element.

Each unit cell of the semiconductor device 100a is the thus configured MISFET having a trench gate structure.

When the source electrode 10 is connected to a ground potential and a bias which is negative relative to a threshold is applied to the gate electrode 9, each unit cell enters an accumulation state in which positive holes are induced in an area located between the source region 4 and the drift region 2d and near the interface between the body region 3 and the gate insulating film 8. Under this state, since the paths of electrons serving as conductive carriers are interrupted, no current is allowed to pass (the off state). In the off state, when a high voltage is applied between the drain electrode 11 and the source electrode 10 such that the drain electrode 11 is positive, the PN junction between the body region 3 and the drift region 2d is reverse-biased, and a depletion layer extends in the body region 3 and the drift region 2d, thereby maintaining the high voltage.

When a positive bias greater than the threshold is applied to the gate electrode 9, each unit cell enters an inversion state in which electrons are induced between the source region 4 and the drift region 2d and near the interface between the body region 3 and the gate insulating film 8, thereby causing an inversion layer to be formed. Consequently, the carriers flow through the source electrode 10, the source region 4, the inversion layer (not shown) extending in the body region 3 and being in contact with the gate insulating film 8, the drift region 2d, the substrate 1, and the drain electrode 11, in this order (the on state).

As will be detailed later in the description of a manufacturing method of the semiconductor device, the trench bottom impurity region 7 is formed by causing silicon carbide constituting part of the trench top impurity region 6 provided in an upper corner portion (the upper peripheral portion) of the trench 5 to move and cover the trench bottom 53. Accordingly, the trench sidewall 50 coincides with the side faces of the trench bottom impurity region 7 nearly without misalignment.

Thus, in the semiconductor device 100a, it is ensured that the trench bottom impurity region 7 of the second conductivity type (P-type) covers the trench bottom 53. Therefore, even when a high voltage is applied between the source and the drain, an electric field to be applied to the trench bottom 53 can be reduced. Consequently, it is ensured that the MISFET withstands the high voltage, and damage to the MISFET can be prevented or reduced.

It is highly unlikely that the trench bottom impurity region 7 is allowed to extend outside the trench 5. This makes it possible to overcome a disadvantage of the conventional techniques: depletion occurs in a portion of the drift region 2d located between a P-type region extending from the bottom of the trench 5 toward the principal face 52 and the body region 3 (of P-type), and the depletion results in an increase in a parasitic resistance component (a JFET resistance component).

—Manufacturing Method of Semiconductor Device—

A manufacturing method of the illustrative semiconductor device of this embodiment will be described next.

Figure 10A:
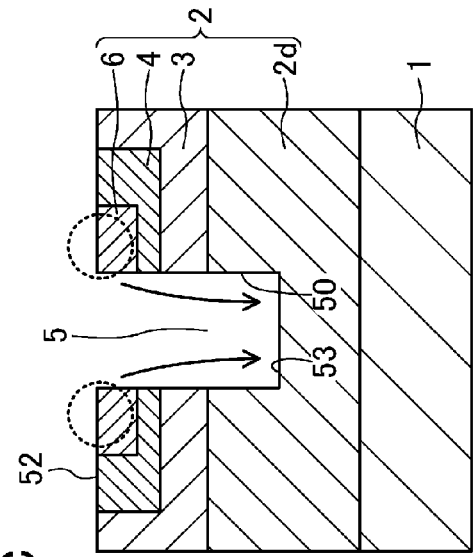
FIGS. 10A-10D illustrate steps of a method for manufacturing the illustrative semiconductor device.

First, a step illustrated in FIG. 10A is performed. In this step, the silicon carbide layer 2 including the drift region 2d, the body region 3, the source region 4, and the trench top impurity region 6 is formed on the substrate 1.

As an example of the substrate 1, a 4H-silicon carbide substrate of the first conductivity type (N-type in this embodiment) having an off-angle of 4° relative to its (0001) Si plane is used. The silicon carbide layer 2 of N-type is epitaxially grown on the (0001) Si plane of the substrate 1. The silicon carbide layer 2 has a carrier concentration of $8 \times 10^{15}$ cm$^{-3}$ and a thickness of 12 μm, for example. As an N-type dopant, nitrogen is used for example.

Next, the P-type body region 3 is formed in a surface portion (an upper portion) of the silicon carbide layer 2. The body region 3 has a carrier concentration of $2 \times 10^{18}$ cm$^{-3}$ and a thickness of 1.2 μm, for example. The body region 3 is formed by implanting P-type impurity ions (e.g. Al ions) into the silicon carbide layer 2, for example. In the silicon carbide layer 2, the potion where the body region 3 does not extend serves as the drift region 2d.

The body region 3 may be epitaxially grown on the N-type silicon carbide layer 2 while supplying a P-type dopant (e.g., trimethylaluminum).

Next, the N-type source region 4 is formed in an upper portion of the body region 3. The source region 4 has a carrier concentration of $5 \times 10^{19}$ cm$^{-3}$ and a thickness of 0.6 μm, for example. The source region 4 is formed by implanting N-type impurity ions (e.g., N ions) into the body region 3 with the use of a mask layer (not shown) formed on the silicon carbide layer 2 and made of, e.g., a silicon oxide or polysilicon.

Next, the trench top impurity region 6 of P-type is formed in an upper portion of the source region 4. The trench top impurity region 6 has a carrier concentration of $1 \times 10^{20}$ cm$^{-3}$ and a thickness of 0.3 μm. The trench top impurity region 6 can be formed by implanting P-type impurity ions (e.g. Al ions) into the N-type source region 4 with the use of a mask layer (not shown) which is a silicon oxide film or a polysilicon film formed on the silicon carbide layer 2. Thereafter, annealing is performed in an inert atmosphere and at 1700° C. for about 30 minutes, for example. This annealing activates the impurities implanted in body region 3, the source region 4, and the trench top impurity region 6.

It is preferable that the P-type impurity concentration (the carrier concentration) of the trench top impurity region 6 is higher than N-type impurity concentration (the carrier concentration) of the source region 4, for the following reason: in a later step of forming the trench bottom impurity region 7, even if part of the source region 4 moves, together with part of the trench top impurity region 6, to the trench bottom 53 and the P-type and the N-type impurities of the regions 4 and 6 compensate (counterbalance) each other, it is ensured that the trench bottom impurity region 7 has P-type conductivity.

Although this embodiment exemplifies the trench top impurity region 6 formed in the upper portion of the source region 4, the trench top impurity region 6 may be formed by epitaxially growing P-type silicon carbide on the upper face of the source region 4.

Figure 10C:
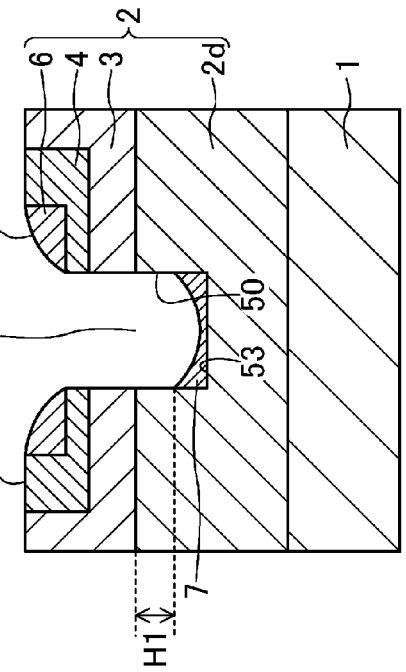
Figure 10B:
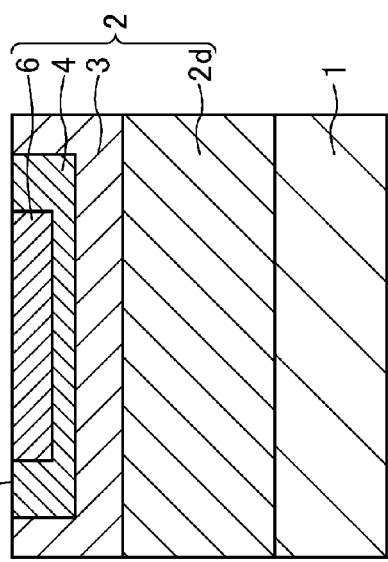

Next, as illustrated in FIG. 10B, the trench 5 is formed in the silicon carbide layer 2. In this embodiment, the trench 5 is formed such that the trench 5 penetrates the source region 4 and the body region 3, and has the trench bottom 53 located in the drift region 2d.

To form the trench 5, a mask layer (not shown) such as a plasma oxide film is formed on part of the source region 4, and then, reactive ion etching (RIE) is performed using the mask layer as a mask. In this manner, the trench 5 which has, e.g., a depth of 1.5 μm and a width of 1 μm is formed in the silicon carbide layer 2.

In the embodiment illustrated in FIG. 10B, the trench sidewall 50 of the trench 5 is substantially perpendicular to the principal face of the substrate 1. The trench sidewall 50, however, may be oblique relative to the direction of a normal to the principal face of the substrate 1. In other words, the trench 5 may have a tapered or reverse-tapered shape of which the width varies along the height.

Figure 10D:
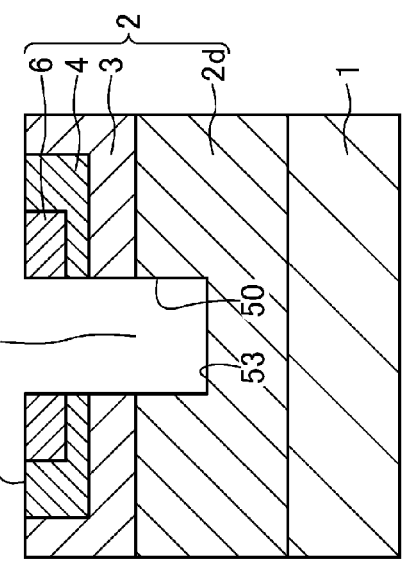

Next, as illustrated in FIGS. 10C and 10D, the trench bottom impurity region 7 which covers the trench bottom 53 and has the same conductivity type as that of the trench top impurity region 6, i.e., the second conductivity type (P-type in this embodiment) is formed. The trench bottom impurity region 7 is formed by causing, by means of a heat treatment in an inert atmosphere, part of the trench top impurity region 6 located in the upper corner portion (the upper peripheral portion) of the trench 5 to move to be placed on the trench bottom 53.

Specifically, the substrate 1 having the silicon carbide layer 2 formed thereon is annealed in an argon (Ar) gas atmosphere at 1530° C. and 200 mbar (200 hPa). The annealing time is five minutes, for example.

This annealing causes the silicon carbide constituting the trench top impurity region 6 to move to be placed on the upper surface of the trench bottom 53. Since the P-type impurity contained in the trench top impurity region 6 also moves to the trench bottom 53 at this time, the trench impurity region 7 has the same conductivity type as that of the trench top impurity region 6. However, when moving to the trench bottom 53, part of the P-type impurity of the trench top impurity region 6 is separated to be left in a vapor phase or compensated by the N-type impurity dispersing from the source region 4 or the drift region 2d, the impurity concentration (the carrier concentration) of the trench bottom impurity region 7 becomes lower than the impurity concentration (the carrier concentration) of the trench top impurity region 6.

The carrier concentration of the trench bottom impurity region 7 depends on the annealing conditions, the trench structure, and the like. The carrier concentration of the trench bottom impurity region 7 of this embodiment is approximately from the range of $10^{16}$ cm$^{-3}$ to the range of $10^{18}$ cm$^{-3}$, for example. The silicon carbide of the trench bottom impurity region 7 is lattice-matched with the silicon carbide of the trench bottom 53 and the trench sidewall 50, and has few crystal defects and high crystal quality. It is presumed that the movement of silicon carbide during formation of the trench bottom impurity region 7 is caused by surface diffusion. However, the present disclosure is not limited to the case where surface diffusion actually causes the movement of silicon carbide.

Since part of the silicon carbide of the upper corner portion of the trench 5 moves and forms the trench bottom impurity region 7, the upper face of the trench top impurity region 6 (corresponding to the trench upper side face 51) is likely to become downwardly oblique toward the inside of the trench 5 in the upper peripheral portion of the trench 5. In addition, the upper face of the trench top impurity region 6 (i.e., the upper corner portion of the trench 5) is likely to have a rounded shape.

Further, the upper face of the trench bottom impurity region 7 is likely to be formed in a roundly concave plane. The upper face is curved and has a curvature radius of about 0.2-0.3 μm, for example.

The annealing can eliminate damage to the crystals on the surface of the trench 5 caused by the RIE performed to form the trench 5. Further, if a sub-trench (a portion further recessed by a large amount of etching on the trench bottom and near the sidewall of the trench) has been formed in a corner portion of the trench bottom 53, the sub-trench is filled with silicon carbide moving during the annealing and becomes negligible.

In this step, the annealing may be performed in an argon (Ar) gas atmosphere containing a P-type dopant gas (e.g., trimethylaluminum or diborane) and at 1530° C. and 200 mbar (200 hPa), for example. If this is the case, the annealing time is also set to five minutes for example. Since this annealing can make the impurity concentration of the trench bottom impurity region 7 higher as compared to a case where no P-type dopant gas is added, it is possible to reduce concentration of electric field on the trench bottom 53 more effectively.

The annealing can form the trench bottom impurity region 7 in a shape which is in contact only with part of a lower portion of the trench sidewall 50 and covers the upper face of the trench bottom 53.

After the annealing in the Ar atmosphere, annealing in a hydrogen atmosphere may be performed. During this annealing, hydrogen etches and removes an unnecessary P-type region which can have been formed on the trench sidewall 50 in the formation of the trench bottom impurity region 7. In this manner, a current path is ensured and a rise in the on-resistance can be reduced.

To ensure the current path, it is desirable that the upper end of the trench bottom impurity region 7 is located below the interface between the body region 3 and the drift region 2d, and the dimension H1 between the upper end and the interface is equal to or larger than a predetermined value (e.g., 0.1 μm).

The conditions of the annealing are not limited those described above. For example, the annealing may be performed in an atmosphere of an inert gas such as argon gas, a hydrogen atmosphere, an atmosphere of a chlorine-based gas, or an atmosphere containing a mixture of the forgoing gases. Further, the annealing may be performed in the presence of the foregoing gases with addition of a dopant gas. It is preferable, however, to form the trench bottom impurity region 7 in an argon gas atmosphere.

Although the annealing temperature is not particularly limited, it is preferable to perform the annealing at a temperature equal to or higher than 1500° C. and equal to or lower than 1600° C., for example. At a temperature equal to or higher than 1500° C., it is possible to cause silicon carbide to move to form the trench bottom impurity region 7 within a short time of one hour or less. At a temperature equal to or lower than 1600° C., it is possible to reduce occurrence of severe roughness such as step bunching and Si missing on the surface of the silicon carbide layer 2. It is desirable to adjust appropriately the specific conditions of the annealing such that the depth and the width of the trench 5 will be within tolerance determined in view of device design.

It is sufficient to change the annealing temperature in accordance with the type of the substrate being used. For example, if a silicon substrate is used, the annealing temperature may be set lower than a temperature at which a silicon carbide substrate is annealed.

Figure 11A:
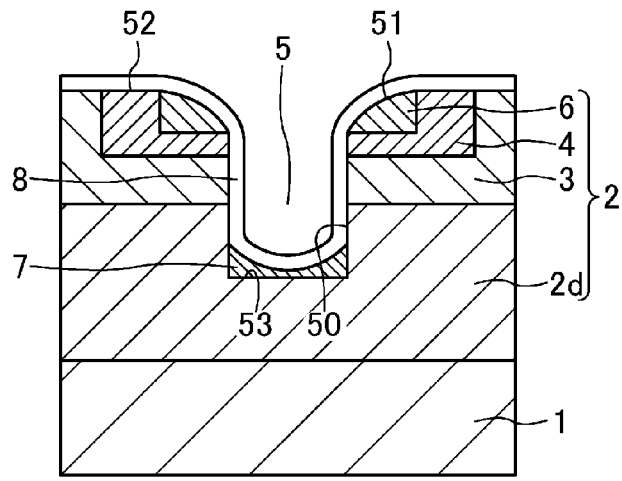
FIGS. 11A-11C illustrate steps subsequent to the step of FIG. 10D of the method for manufacturing the illustrative semiconductor device.

Next, as illustrated in FIG. 11A, the gate insulating film 8 covering the trench sidewall 50, the upper face of the trench bottom impurity region 7, and the trench upper side face 51 (the upper face of the trench top impurity region 6) is formed.

To form the gate insulating film 8, the substrate 1 above which the trench 5 has been formed is washed, and then, placed in a thermal oxidation furnace, where the substrate 1 is subjected to processing in a dry oxidation atmosphere at 1200° C. for half an hour. In this manner, a silicon oxide film (a thermal oxide film) serving as the gate insulating film 8 is formed on the trench sidewall 50, the upper face of the trench bottom impurity region 7, and the trench upper side face 51.

A nitrogen-containing silicon oxide film may be formed instead of the silicon oxide film. Since use of the nitrogen-containing silicon oxide film reduces interface state density at the interface between the gate insulating film 8 and the body region 3, improvement of channel mobility is expected.

Figure 11B:
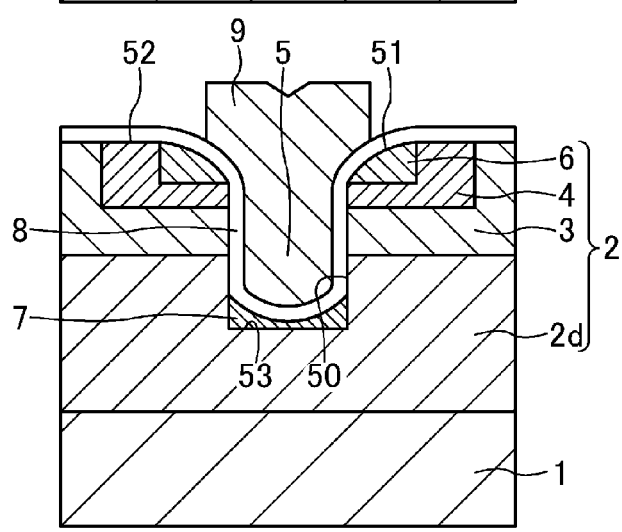

Next, as illustrated in FIG. 11B, the gate electrode 9 is formed such that the gate electrode 9 extends in the trench 5, above the upper surface of the silicon carbide layer 2, and on the gate insulating film 8.

Specifically, a deposit of phosphorus (P)-doped polysilicon having a thickness of, e.g., 1000 nm is formed on the entire surface of the wafer by low pressure CVD (LP-CVD). Next, the wafer is subjected to rapid thermal annealing (RTA) in, e.g., an inert atmosphere at 1000° C. for 60 seconds to activate phosphorus. Thereafter, a mask layer (not shown) such as a resist having an opening corresponding to the portion other than the trench 5 is formed. The polysilicon layer is then etched by RIE, thereby forming the gate electrode 9. The gate electrode 9 is not limited to the shape illustrated in FIG. 11B, and may occupy part of the inside of the trench 5 for example.

Figure 11C:
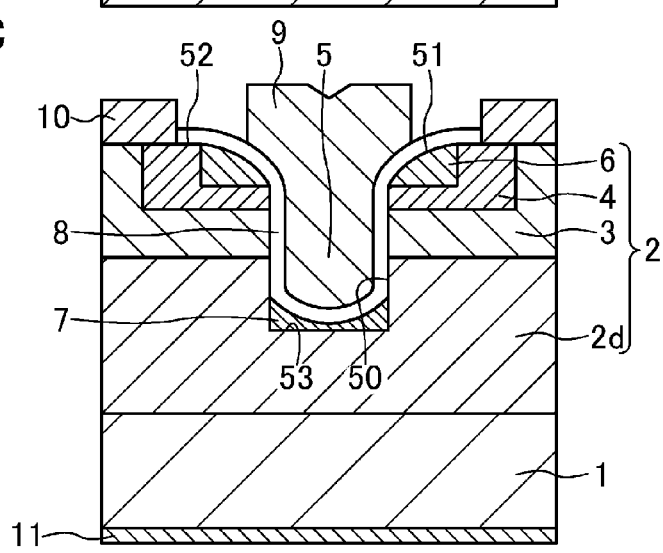

Next, as illustrated in FIG. 11C, the source electrode 10 is formed such that the source electrode 10 is in contact with the body region 3 and the source region 4. The source electrode 10 is formed on the upper surface of the silicon carbide layer 2 so as to extend on the body region 3 and the source region 4.

Specifically, an interlayer insulating film (not shown) covering the silicon carbide layer 2 and the gate electrode 9 is formed first. Next, an opening through which part of the source region 4 and part of the body region 3 are exposed is formed in the interlayer insulating film. A conductive film (e.g. a metal film of Ti) is formed in this opening, and annealing is performed as necessary. In this manner, the source electrode 10 being in ohmic contact with the source region 4 and the body region 3 is obtained.

Further, the drain electrode 11 is formed on the back face (the face opposite to the principal face) of the substrate 1.

In this manner, each of the unit cells of the semiconductor device, which is a MISFET having a trench gate structure, can be obtained.

According to this manufacturing method, the trench bottom impurity region 7 can be formed so as to cover the trench bottom 53 in a self-aligned manner. Accordingly, occurrence of misalignment is prevented, which can surely reduce concentration of electric field on the trench bottom 53 and can prevent dielectric breakdown of the gate insulating film 8 on the trench bottom 53 and a decrease in reliability of the gate insulating film 8.

Further, since the trench bottom impurity region 7 is formed by causing silicon carbide to move into the trench 5, it is possible to make the width of the trench bottom impurity region 7 equivalent to the width of the trench 5. Accordingly, it is possible to reduce depletion in the N-type region between the P-type body region and the P-type region formed on the trench bottom, and a parasitic resistance component (a JFET resistance component) which can be produced by the depletion.

Furthermore, according to this manufacturing method, since the trench bottom impurity region 7 can be formed by means of the annealing, the trench bottom 53 does not suffer damage which could be caused by ion implantation. In addition, since this manufacturing method enables formation of the trench bottom impurity region 7 at a temperature lower than a temperature of activation annealing in ion plantation, the roughness on the wall of the trench 5 can be reduced as compared to a case where ion implantation is performed.

Moreover, since the trench bottom impurity region 7 is epitaxially grown on, and lattice-matched with the trench bottom 53, the trench bottom impurity region 7 has high quality crystallinity. Consequently, the gate insulating film 8 formed on the trench bottom impurity region 7 can be improved in reliability.

As the gate insulating film 8, a nitrogen-containing silicon oxide film may be formed. Since use of the nitrogen-containing silicon oxide film reduces interface state density at the interface of the gate insulating film, improvement of channel mobility is expected. Further, the gate insulating film 8 may include a film other than the thermal oxide film. A deposited film formed by, e.g., chemical vapor deposition (CVC) or sputtering may be used as the gate insulating film 8.

(Variation of Semiconductor Device)

A variation of the above semiconductor device will be described below with reference to the drawings.

Figure 12A:
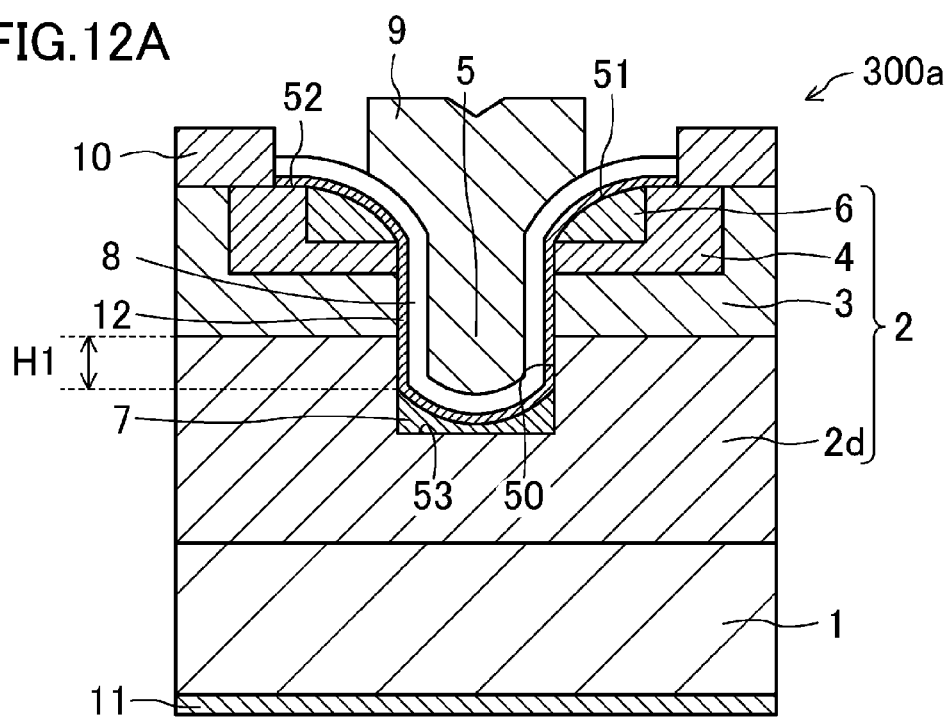
FIGS. 12A and 12B are respectively a cross-sectional view and a plan view which schematically illustrate a structure of a semiconductor device according to a variation of the second embodiment of the present disclosure.
Figure 12B:
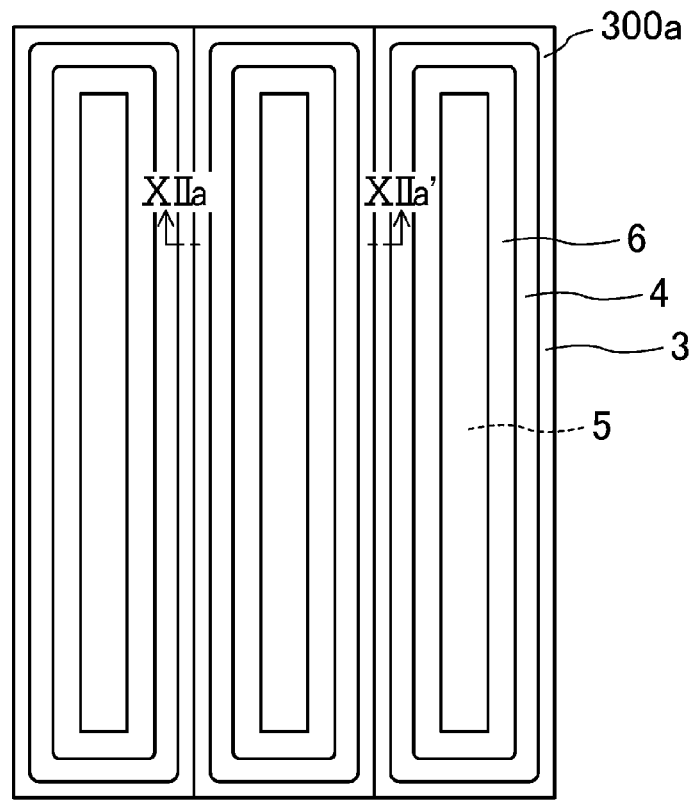

FIG. 12A schematically illustrates a cross-sectional configuration of one of the plurality of unit cells included in a semiconductor device 300a according to this variation. FIG. 12B schematically illustrate an exemplary configuration of the semiconductor device viewed from above, specifically, the surfaces of silicon carbide layers of the plurality of unit cells (three unit cells in this variation). FIG. 12A is the cross-sectional view taken along the line XIIa-XIIa' in FIG. 12B. In FIGS. 12A and 12B, components which are the same as those of the semiconductor device 100a illustrated in FIGS. 9A and 9B are denoted by the same reference characters. The following description will be mainly focused on differences between the semiconductor devices of the embodiment and the variation.

As illustrated in FIG. 12A, each cell of the semiconductor device 300a of the variation includes, between the trench sidewall 50 and the gate insulating film 8, a channel layer 12 made of silicon carbide of the first conductivity type (N-type in this variation). The channel layer 12 has a carrier concentration of $1\times10^{18}$ cm$^{-3}$ and a thickness of 20 nm, for example. The carrier concentration (the impurity concentration) of the channel layer 12 is preferably higher than the carrier concentrations of the drift region 2d and the trench bottom impurity region 7.

The channel layer 12 is effective at reducing depletion in the N-type region (the drift region 2d) between the P-type body region 3 and the P-type trench bottom impurity region 7. Accordingly, this variation can reduce a parasitic resistance component (a JFET resistance component) more surely than the configuration illustrated in FIGS. 9A and 9B does.

The channel layer 12 may have either a single layer structure or a multilayer structure, provided that any layer included in the channel layer 12 has a carrier concentration higher than that of the drift region 2d. It is sufficient to adjust the thickness of the channel layer 12 as appropriate in accordance with a design value of a gate threshold voltage.

In the variation illustrated in FIG. 12A, the channel layer 12 covers the entire inner wall of the trench 5, inclusive of the upper face of the trench top impurity region 6. However, a portion of the channel layer 12 located at least between the gate insulating film 8 and the body region 3 functions as a channel through which carriers move. When the channel layer 12 is in contact with the upper face of the trench top impurity region 6, a depletion layer is formed between the channel layer 12 of N-type and the trench top impurity region 6 of P-type. In this case, the formation of the depletion layer makes it possible to render small the capacity formed between the gate electrode 9 and the source region 4 without increasing the thickness of the gate insulating film 8.

A MOSFET including the channel layer 12 of the first conductivity type (N-type in this variation) is called accumulation-type MOSFET, and operation of such an accumulation-type MOSFET is partially different from operation of a MOSFET which does not include the channel layer 12 (see FIGS. 9A and 9B).

For example, in the off state where a bias which is negative relative to the threshold is applied to the gate electrode 9, since the MOSFET enters a depletion state in which the PN junction between the channel layer 12 and the body region 3 causes depletion to occur in the channel layer 12, no current is allowed to flow. In the on state where a positive bias greater than the threshold is applied to the gate electrode 9, since the MOSFET enters an accumulation state in which a high density of electrons is accumulated in the channel layer 12, a current is allowed to flow.

A manufacturing method of the semiconductor device 300a of this variation is described next.

Figure 13A:
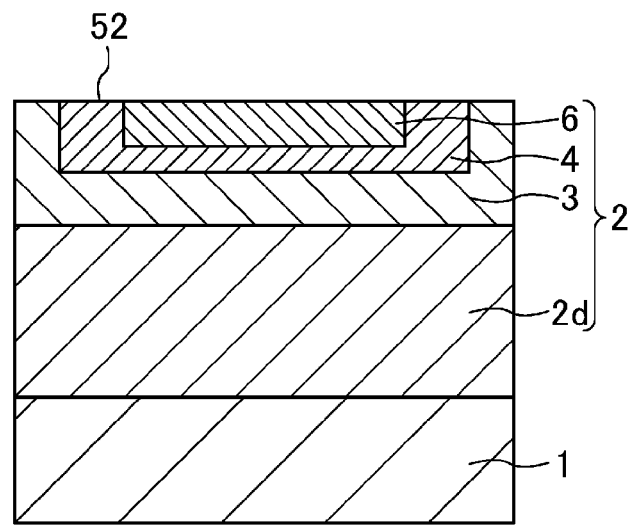
FIGS. 13A and 13B illustrate steps of a method for manufacturing the semiconductor device of the variation.
Figure 13B:
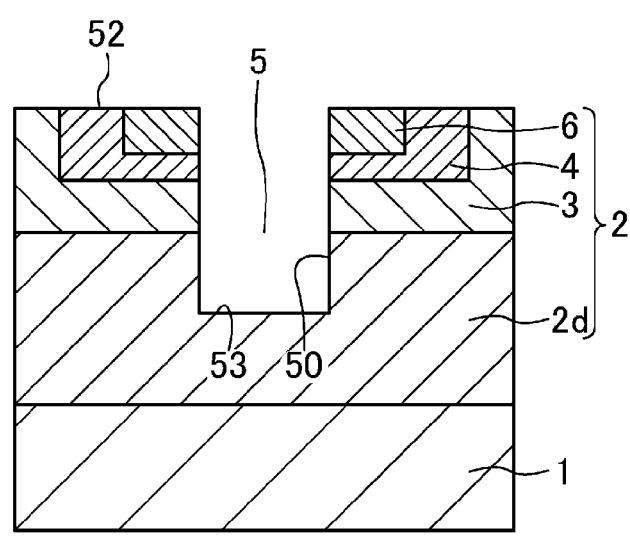

First, as illustrated in FIG. 13A, the silicon carbide layer 2 including the drift region 2d, the body region 3, the source region 4, and the trench top impurity region 6 is formed on the substrate 1. Subsequently, as illustrated in FIG. 13B, the trench 5 is formed such that the trench 5 penetrates the trench top impurity region 6, the source region 4, and the body region 3 of the silicon carbide layer 2, and has the trench bottom 53 located in the drift region 2d. It is sufficient to perform these steps in a manner similar to the steps described with reference to FIGS. 10A and 10B in the manufacturing method of the semiconductor device 100a.

Figure 14A:
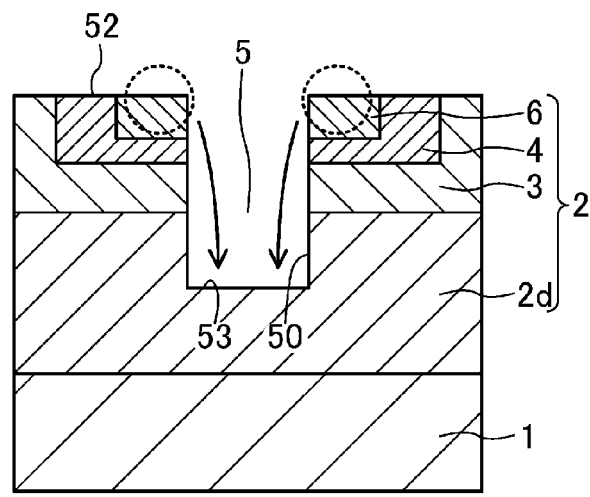
FIGS. 14A-14C illustrate steps subsequent to the step of FIG. 13B of the method for manufacturing the semiconductor device of the variation.
Figure 14B:
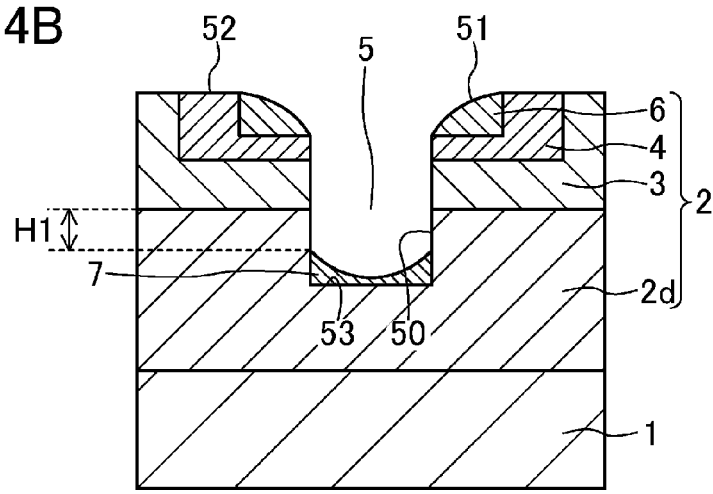

Next, as illustrated in FIGS. 14A and 14B, the trench bottom impurity region 7 which is of the second conductivity type (P-type in this variation) and covers the trench bottom 53 is formed in the following manner: annealing is performed in, e.g., an atmosphere of an inert gas such as argon gas, thereby causing part of silicon carbide constituting the trench top impurity region 6 provided in the upper corner portion (the upper peripheral portion) of the trench 5 to move to be placed on the trench bottom 53. More specifically, this step is sufficiently performed in a manner similar to the step described with reference to FIGS. 10C and 10D in the manufacturing method of the semiconductor device 100a.

Figure 14C:
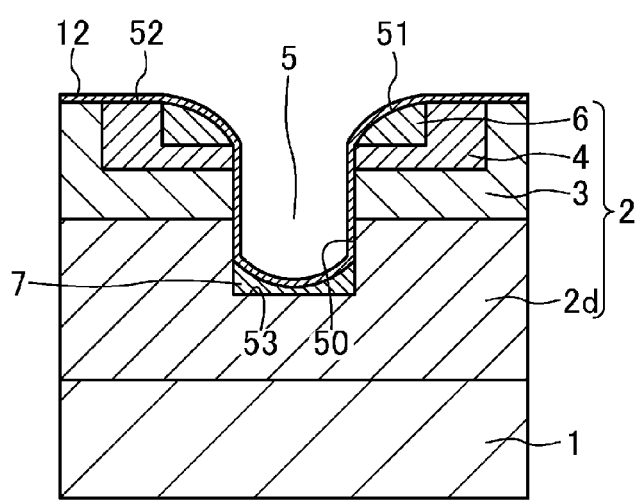

Next, as illustrated in FIG. 14C, the channel layer 12 made of silicon carbide is formed inside the trench 5. Specifically, the channel layer 12 is formed so as to cover the trench sidewall 50, the upper face of the trench bottom impurity region 7, the trench upper side face 51 (the upper face of the trench top impurity region 6), the upper face of the source region 4 surrounding the trench 5, and the upper face of the body region 3. The channel layer 12 is made of silicon carbide of the first conductivity type (N-type in this variation) having a carrier concentration of $1\times10^{18}$ cm$^{-3}$.

The channel layer 12 is formed in a CVD apparatus for example. The CVD apparatus is supplied with a silicon-based gas (e.g. silane gas), a carbon-based gas (e.g. propane gas), and a dopant gas (e.g. Nitrogen gas if N-type is desired), and the CVD apparatus is heated to a temperature equal to or higher than 1500° C. and equal to or lower than 1600° C. However, the present disclosure is not limited to these conditions. For example, the channel layer 12 can be epitaxially grown in a wider temperature range (e.g., between 1450° C. and 1650° C. inclusive) in a sufficient manner.

Note that, after forming the trench bottom impurity region 7 as illustrated in FIGS. 14A and 14B, the channel layer 12 illustrated in FIG. 14C can be grown in the same apparatus in a continuous manner.

It is also possible to form, instead of the channel layer 12, an N-type channel layer by implanting ions into the trench sidewall 50. It is, however, more preferable to use the channel layer 12 formed by epitaxial growth because damage to crystals is reduced.

Figure 15A:
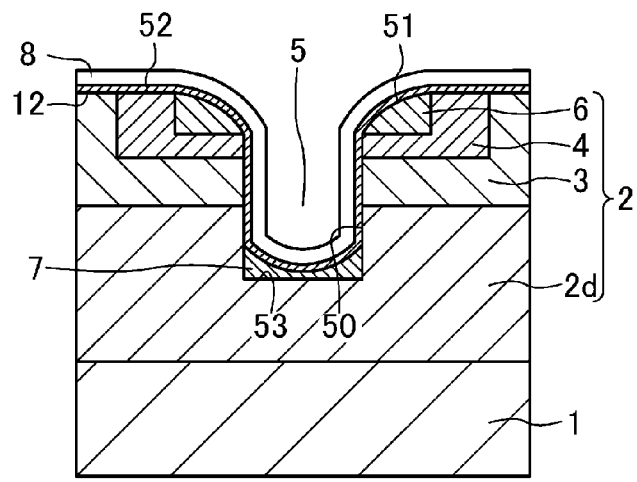
FIGS. 15A-15C illustrate steps subsequent to the step of FIG. 14C of the method for manufacturing the semiconductor device of the variation.

Next, as illustrated in FIG. 15A, the gate insulating film 8 covering the channel layer 12 in and around the trench 5 is formed. The gate insulating film 8 may be a silicon oxide film formed by thermal oxidation, a nitrogen-containing silicon oxide film, or a deposited film formed by CVD or sputtering. The gate insulating film 8 is sufficiently formed in a manner similar to the step described with reference to FIG. 11A in the manufacturing method of the semiconductor device 100a.

Figure 15B:
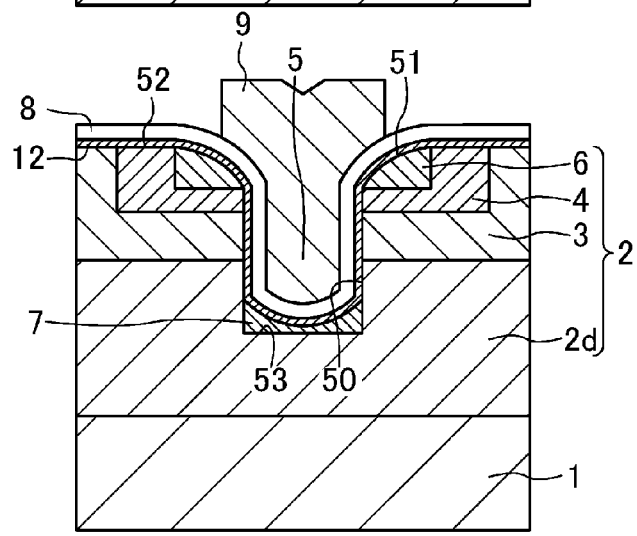

Next, as illustrated in FIG. 15B, the gate electrode 9 is formed such that the gate electrode 9 extends in the trench 5, above the upper surface of the silicon carbide layer 2, and on the gate insulating film 8. For example, after forming a deposited film of phosphorus (P)-doped polysilicon by LP-CVD, phosphorus is activated by RTA, and a portion of the film is etched and removed so as to leave a predetermined portion. More specifically, the gate electrode 9 is sufficiently formed in a manner similar to the step described with reference to FIG. 11B in the manufacturing method of the semiconductor device 100a.

Figure 15C:
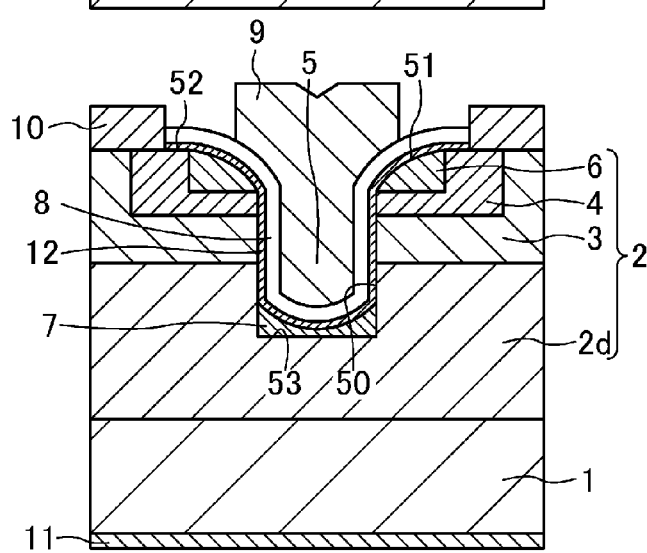

Thereafter, as illustrated in FIG. 15C, the source electrode 10 is formed such that the source electrode 10 extends on the body region 3 and the source region 4. Further, the drain electrode 11 is formed on the back face (the face opposite to the principal face) of the substrate 1. The source electrode 10 and the drain electrode 11 are sufficiently formed in a manner similar to the step described with reference to FIG. 11C in the manufacturing method of the semiconductor device 100a.

The semiconductor device 300a according to this variation is thus manufactured. In this variation, the trench bottom impurity region 7 covering the trench bottom 53 is also formed by causing silicon carbide of the upper corner portion of the trench 5 to move. Accordingly, the semiconductor device 300a offers advantages similar to those offered by the semiconductor device 100a. Specifically, the trench bottom impurity region 7 is formed in a self-aligned manner relative to the trench 5 without allowing misalignment, which can prevent dielectric breakdown of the gate insulating film 8 on the trench bottom 53 and a decrease in reliability of the gate insulating film 8. It is also possible to reduce depletion in the N-type region between the P-type body region and the P-type region formed on the trench bottom 53, and a parasitic resistance component (a JFET resistance component) which can be produced by the depletion. In addition, the channel layer 12 can reduce production of the parasitic resistance component (the JFET resistance component) more surely, as described above.

In the above embodiment and the variation, the drift region 2d is of N-type whereas the trench top impurity region 6 and the trench bottom impurity region 7 are of P-type. On the contrary, the semiconductor devices may include the drift region 2d of P-type and the trench bottom impurity region 7 of N-type. In other words, the above-described semiconductor devices may be configured such that the first conductivity type is P-type and the second conductivity type is N-type.

In the above embodiment and the variation, the vertical MISFETs having a trench gate structure have been described as typical examples. It is, however, possible to apply, to semiconductor devices of other types, the structure in which the trench, the first semiconductor region of the first conductivity type, and the trench bottom impurity region and the trench top impurity region of the second conductivity type are combined, the manufacturing method of the structure, and in particular, the method for forming the trench bottom impurity region.

For example, the method for forming the trench bottom impurity region of the present disclosure may be applied to a P-type layer in a guard ring of a transistor or a diode, a P-type layer of a merged PiN and Shottky bather (MPS) diode, a P-type layer of a junction-barrier Schottky (JBS) diode, and the like. Since the method of the present disclosure does not employ ion implantation and CVD which are performed in conventional methods, the application of the method of the present disclosure is advantageous in that a P-type layer having high crystallinity and high quality can be selectively formed on a trench bottom, and is expected to improve reliability of the semiconductor device.

Figure 16:
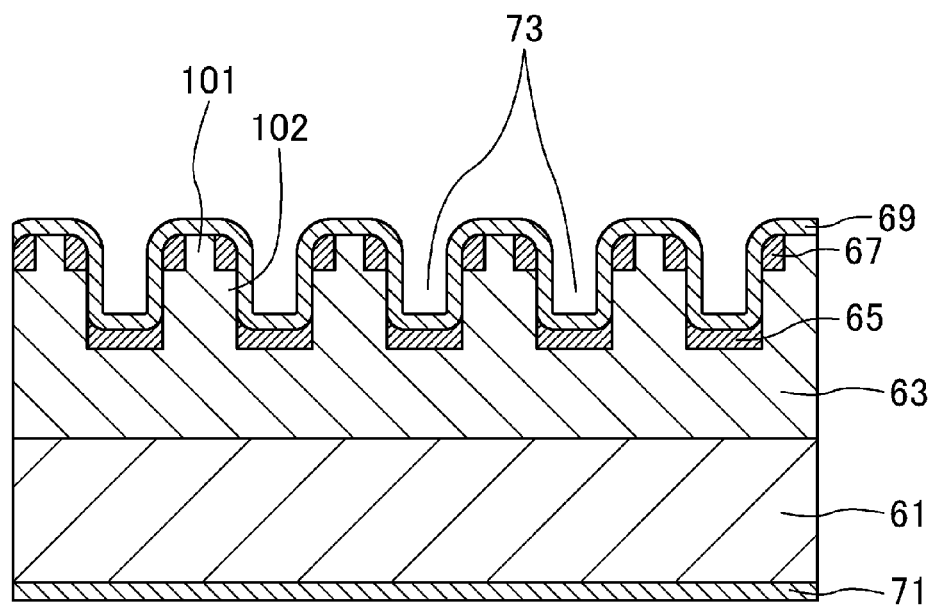
FIG. 16 is a cross-sectional view schematically illustrating a structure of an example of a diode to which the structure of the semiconductor device of the second embodiment is applied.

FIG. 16 is a cross-sectional view schematically illustrating a structure of a JBS diode to which the technique of the present disclosure is applied. This JBS diode to which the technique of the present disclosure is applied includes a substrate 61 of the first conductivity type (N-type in this example) and a semiconductor layer (a first semiconductor region) 63 of the first conductivity type (N-type) formed on the substrate 61. A plurality of trenches 73 are arranged in the semiconductor layer 63, and trench bottom impurity regions 65 of the second conductivity type (P-type in this example) are each formed so as to cover a corresponding one of the bottoms of the trenches 73. Further, trench top impurity regions 67 of the second conductivity type (P-type in this example) are each formed in an upper peripheral portion (an upper corner portion) of a corresponding one of the trenches 73. Furthermore, a first electrode 69 extends in the trenches 73 and on the semiconductor layer 63. The substrate 61 has a second electrode 71 formed on its back face. Part of the upper corner portion of each trench 73 is removed, and the upper surfaces of the trench top impurity regions 67 are rounded for example. The upper face of each trench bottom impurity region 65 is curved and downwardly convex for example. The lower face of each trench bottom impurity region 65 may be flat, extend in a sub-trench, or be rounded, for example.

Here, the first electrode 69 is made of a metal which causes a Schottky barrier to be formed on the semiconductor layer 63. For example, when the semiconductor layer 63 is made of 4H-SiC, Ti is selected as a material for the first electrode 69.

In this structure, the bottoms of the trenches 73 are protected by the trench bottom impurity regions 65, and the upper peripheral portions of the trenches 73 are protected by the trench top impurity regions 67. Regions 101 which are portions of the semiconductor layer 63 each sandwiched between adjacent ones of the trench top impurity regions 67 and regions 102 which are portions of the semiconductor layer 63 each located near the sidewalls of the trenches 73 and between the trench top impurity regions 67 and the trench bottom impurity regions 65 are in Schottky junction with the first electrode 69. Thus, by causing the first electrode 69 to serve as an anode and the second electrode 71 to serve as a cathode, the semiconductor device of FIG. 16 functions as a JBS diode. When a forward bias is applied to the JBS diode, a diode current flows from the first electrode 69 to the second electrode 71 through the regions 101 and 102. On the other hand, when a reverse bias is applied to the JBS diode, since the reverse bias is applied to the pn junctions formed by the trench top impurity regions 67, the trench bottom impurity regions 65, and the semiconductor layer 63, depletion layers extend from the pn junctions. These depletion layers overlap depletion layers extending from adjacent ones of the trench top impurity regions 67 and the trench bottom impurity regions 65, thereby advantageously interrupt a leak current at the Schottky junction of the regions 101 and 102.

In order to build this structure, the above-described method for forming the trench bottom impurity region 7 of, e.g., the semiconductor device 100a can be utilized. Specifically, after forming the trench top impurity regions 67 and the trenches 73 in the semiconductor layer 63, annealing is performed in an atmosphere of an inert gas such as argon gas. This annealing causes semiconductor elements of the upper corner portions of the trenches 73 (i.e., part of each trench top impurity regions 67) to move to the bottoms of the trenches 73, thereby forming the trench bottom impurity regions 65 of P-type. Thus, the trench bottom impurity regions 65 can be formed in a self-aligned manner with respect to the trenches 73.

The MPS diode can be produced by, e.g., adjusting a carrier concentration of the trench bottom impurity regions 65 or the trench top impurity regions 67, or adjusting annealing conditions of the first electrode 69 such that the trench bottom impurity regions 65 and the first electrode 69, or the trench top impurity regions 67 and the first electrode 69 are in ohmic contact.

In each of the above-described first and second embodiments, an insulated gate bipolar transistor (IGBT) can be formed by causing the substrate and the semiconductor layer formed directly on the substrate to have different conductivity types. In such an IGBT, the source electrode 10, the drain electrode 11, and the source region 4 are referred to as an emitter electrode, a collector electrode, and an emitter region, respectively.

Accordingly, an N-type IGBT can be obtained by causing each of the above-described semiconductor devices to include the drift region and the emitter region of N-type conductivity and the substrate and the body region of P-type conductivity. In such a case, an N-type buffer layer may be provided between the P-type substrate and the N-type drift region. A P-type IGBT can be obtained by causing each of the above-described semiconductor devices to include the drift region and the emitter region of P-type conductivity and the substrate and the body region of N-type conductivity. In such a case, a P-type buffer layer may be provided between the N-type substrate and the P-type drift region.

Although the above embodiments and variations exemplify the plurality of unit cells arranged in parallel with one another, the unit cells may be arranged in any pattern.

Although the above embodiments and variations exemplify the trenches 5 having a rectangular shape as viewed from above and the unit cells arranged such that the long sides of the plurality of trenches become parallel to one another, the shape of the trenches viewed from above is not limited to this. For example, the trenches may have a square shape as viewed from above. If this is the case, a width direction of each trench refers to a direction along any one side of the trench.

The above embodiments and variations exemplify the substrate 1 made of 4H-SiC and having the (0001) Si plane serving as the principal face on which the silicon carbide layer 2 is formed. However, the silicon carbide layer 2 may be formed on the (000-1) C plane and the drain electrode 11 may be formed on the (0001) Si plane. The principal face may have a plane orientation of another crystal face. Alternatively, a desired off-cut plane of the Si plane or C plane may serve as the principal face of the substrate. Further, a SiC substrate of other polytype may be used.

Furthermore, the present disclosure is applicable to, in addition to the semiconductor devices including a SiC substrate, semiconductor devices including a wide band gap semiconductor such as gallium nitride or diamond. The present disclosure is also applicable to a semiconductor device including silicon.

In addition, the shapes, sizes, impurity concentrations, constituent materials, etc. of the components of the above-described semiconductor devices and variations thereof may be changed as appropriate without deviating from the spirit and scope of the present disclosure.

INDUSTRIAL APPLICABILITY

The semiconductor devices and the manufacturing methods thereof according to the present disclosure are useful for, e.g., semiconductor devices with a trench gate structure, and more specifically, for power semiconductor devices for use in electric vehicles (EVs), hybrid electric vehicles (HEVs), or inverters of industrial equipment.

DESCRIPTION OF REFERENCE CHARACTERS

1, 61 Substrate
2 Silicon carbide layer
2d Drift region
3 Body region
4 Source region
5, 73 Trench
6, 67 Trench top impurity region
7, 65 Trench bottom impurity region
8 Gate insulating film
9 Gate electrode
10 Source electrode
11 Drain electrode
12 Channel layer
16 Dopant
50 Trench sidewall
51 Trench upper side face
52 Principal face
53 Trench bottom
63 Semiconductor layer
69 First electrode
71 Second electrode
100, 100a, 300, 300a Semiconductor device

The invention claimed is:

1. A method for manufacturing a semiconductor device, the method comprising the steps of:
   forming, on a principal face of a substrate, a semiconductor layer including a first semiconductor region of a first conductivity type;
   forming, in the semiconductor layer, a trench having a bottom located in the first semiconductor region; and
   forming a trench bottom impurity region being of a second conductivity type and covering the bottom of the trench by performing annealing to cause part of the semiconductor layer to move to be placed on the bottom of the trench, the part corresponding to an upper corner portion of the trench.

2. The method of claim 1, wherein
   the annealing is performed in an atmosphere containing a dopant gas of the second conductivity type, thereby forming the trench bottom impurity region of the second conductivity type.

3. The method of claim 2, further comprising, after the step of forming the trench bottom impurity region, the steps of:
   forming a gate insulating film covering side faces of the trench and an upper face of the trench bottom impurity region; and forming a gate electrode on the gate insulating film, the gate electrode extending at least n the trench, wherein the semiconductor layer includes a drift region which is the first semiconductor region, a body region which is of the second conductivity type and provided on the drift region, and an impurity region which is of the first conductivity type and provided on the body region, and a second semiconductor region which is of the first conductivity type and provided on the body region, and the trench penetrates the second semiconductor region and the body region, and reaches an inside of the drift region.

4. The method of claim 1, wherein in the step of forming the trench bottom impurity region, etching is performed in a hydrogen atmosphere after the annealing.

5. The method of claim 1, wherein in the step of forming the semiconductor layer, a trench top impurity region of the second conductivity type is further formed above the first semiconductor region, in the step of forming the trench, the trench is caused to penetrate further the trench top impurity region, and in the step of forming the trench bottom impurity region, the trench bottom impurity region of the second conductivity type is formed by causing part of the trench top impurity region to move to be placed on the bottom of the trench.

6. The method of claim 5, further comprising, after the step of forming the trench bottom impurity region, the steps of:

forming a gate insulating film covering side faces of the trench and an upper face of the trench bottom impurity region; and forming a gate electrode on the gate insulating film, the gate electrode extending at least in the trench, wherein the semiconductor layer includes a drift region which is the first semiconductor region, a body region which is of the second conductivity type and provided on the drift region, a second semiconductor region which is of the first conductivity type and provided on the body region, and the trench top impurity region formed on the second semiconductor region, and the trench penetrates the trench top impurity region, the second semiconductor region, and the body region, and reaches an inside of the drift region.

7. The method of claim 5, wherein the annealing includes a heat treatment to be performed in a presence of an inert gas.

8. The method of claim 7, wherein in the step of forming the trench bottom impurity region, etching is performed in a hydrogen atmosphere after performing the heat treatment in the presence of the inert gas.

9. The method of claim 7, wherein in the step of forming the trench bottom impurity region, the heat treatment is performed in the presence of the inert gas and in an atmosphere containing a dopant gas of the second conductivity type.

10. The method of claim 3, further comprising the steps of:

forming a drain electrode on a back face of the substrate; and forming a source electrode on the second semiconductor region and the body region, wherein the second semiconductor region is a source region, and the substrate is of the first conductivity type.

11. The method of claim 3, further comprising:

before the step of forming the gate insulating film, a step of forming a channel layer of the first conductivity type on side faces of the body region constituting part of the side faces of the trench.

12. The method of claim 1, wherein the substrate and the semiconductor layer are made of silicon carbide.

13. The method of claim 12, wherein the annealing is performed at a temperature equal to or higher than 1500° C. and equal to or lower than 1600° C.

14. A semiconductor device comprising:

a substrate;

a semiconductor layer formed on a principal face of the substrate and including a first semiconductor region of a first conductivity type;

a trench formed in the semiconductor layer and having a bottom located in the first semiconductor region;

a trench bottom impurity region being of the second conductivity type and covering the bottom of the trench; and a gate insulating film covering side faces of the trench, the trench bottom impurity region, and an upper peripheral portion of the trench, wherein:

in the upper peripheral portion of the trench, an upper face of the semiconductor layer is rounded, the semiconductor layer includes a drift region which is the first semiconductor region, a body region which is of the second conductivity type and provided on the drift region, a second semiconductor region which is of the first conductivity type and provided on the body region, and the trench top impurity region which is of the second conductivity type and provided on the second semiconductor region, the trench penetrates the trench top impurity region, the second semiconductor region, and the body region, and reaches an inside of the drift region, the semiconductor device further includes:

a gate electrode provided on the gate insulating film and extending in the trench and above the upper face of the semiconductor layer;

a drain electrode provided on a back face of the substrate;

a source electrode extending on the second semiconductor region and the body region; and a channel layer being of the first conductivity type and extending at east between the body region and the gate insulating film, the second semiconductor region is a source region, the substrate is of the first conductivity type, the channel layer is in contact with an upper face of the trench top impurity region, and the trench top impurity region is out of contact with the source electrode.

15. The semiconductor device of claim 14, wherein the upper face of the trench bottom impurity region is located below an interface between the drift region and the body region.

16. The semiconductor device of claim 14, wherein, the upper face of the trench bottom impurity region is concave.

17. The semiconductor device of claim 14, wherein, the side faces of the trench coincide with side faces of the trench bottom impurity region.

18. The semiconductor device of claim 14, wherein, the substrate and the semiconductor layer are made of silicon carbide.

19. The semiconductor device of claim 14, wherein an impurity concentration of the trench top impurity region is higher than that of the trench bottom impurity region.

20. The semiconductor device of claim 14, wherein a concentration of an impurity of the second conductivity type in the trench top impurity region is higher than a concentration of an impurity of the first conductivity type in the second semiconductor region.

* * * * *